US011424207B1

(12) United States Patent
Shao et al.

(10) Patent No.: US 11,424,207 B1
(45) Date of Patent: Aug. 23, 2022

(54) NON-VOLATILE MEMORY WITH DIFFERENT USE OF METAL LINES IN WORD LINE HOOK UP REGIONS

(71) Applicant: SANDISK TECHNOLOGIES LLC, Addison, TX (US)

(72) Inventors: Shiqian Shao, Fremont, CA (US); Fumiaki Toyama, Cupertino, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/246,472

(22) Filed: Apr. 30, 2021

Related U.S. Application Data

(60) Provisional application No. 63/171,073, filed on Apr. 5, 2021.

(51) Int. Cl.
*H01L 25/18* (2006.01)
*H01L 25/00* (2006.01)
(Continued)

(52) U.S. Cl.
CPC .......... *H01L 24/08* (2013.01); *G11C 11/5628* (2013.01); *G11C 11/5671* (2013.01); *G11C 16/0483* (2013.01); *G11C 16/10* (2013.01); *G11C 16/3459* (2013.01); *H01L 24/80* (2013.01); *H01L 25/0657* (2013.01); *H01L 25/18* (2013.01); *H01L 25/50* (2013.01); *H01L 27/11556* (2013.01); *H01L 27/11582* (2013.01); *H01L 2224/08145* (2013.01); *H01L 2224/80895* (2013.01); *H01L 2224/80896* (2013.01);
(Continued)

(58) Field of Classification Search
CPC ..... H01L 24/08; H01L 24/80; H01L 25/0657; H01L 25/18; H01L 25/50; H01L 2224/08145; H01L 2224/80895; H01L 2224/80896; H01L 2924/1431; H01L 2924/14511; G11C 11/5628; G11C 16/10; G11C 16/0483; G11C 16/3459
See application file for complete search history.

(56) References Cited

U.S. PATENT DOCUMENTS 8,951,859 B2 2/2015 Higashitani
9,484,314 B2 11/2016 Shimoda
(Continued)

FOREIGN PATENT DOCUMENTS

CN 110998844 A 4/2020

OTHER PUBLICATIONS

Shao, et al., "Non-Volatile Memory With Different Word Line Hook up Regions Based On Pass Through Signals," U.S. Appl. No. 17/246,469, filed Apr. 30, 2021.
(Continued)

*Primary Examiner* — Thanh Y. Tran
(74) *Attorney, Agent, or Firm* — Vierra Magen Marcus LLP

(57) ABSTRACT

To overcome a shortage of area for horizontal metal lines to connect word line switch transistors to corresponding word lines and for pass through signal lines, it is proposed to implement multiple architectures for the word line hook up regions. For example, some areas of a die will be designed to provide extra horizontal metal lines to connect word line switch transistors to word lines and other areas of the die will be designed to provide extra pass through signal lines.

20 Claims, 26 Drawing Sheets

(51) Int. Cl.
  *H01L 23/00* (2006.01)
  *H01L 27/11556* (2017.01)
  *H01L 27/11582* (2017.01)
  *G11C 11/56* (2006.01)
  *G11C 16/04* (2006.01)
  *G11C 16/10* (2006.01)
  *G11C 16/34* (2006.01)
  *H01L 25/065* (2006.01)

(52) U.S. Cl.
  CPC ............ *H01L 2225/06506* (2013.01); *H01L 2225/06541* (2013.01); *H01L 2225/06562* (2013.01); *H01L 2924/1431* (2013.01); *H01L 2924/14511* (2013.01)

(56) References Cited

U.S. PATENT DOCUMENTS

| | | | |
|---|---|---|---|
| 10,283,493 | B1 | 5/2019 | Nishida |
| 10,629,616 | B1 | 4/2020 | Kai |
| 2010/0244269 | A1 | 9/2010 | Kim |
| 2013/0270568 | A1 | 10/2013 | Rabkin et al. |
| 2013/0272069 | A1 | 10/2013 | Rabkin et al. |
| 2014/0071763 | A1 | 3/2014 | Shikata et al. |
| 2014/0226415 | A1 | 8/2014 | Toyama |
| 2014/0286095 | A1 | 9/2014 | Hishida et al. |
| 2016/0049201 | A1 | 2/2016 | Lue et al. |
| 2017/0076799 | A1 | 3/2017 | Namai |
| 2017/0309339 | A1 | 10/2017 | Hsiung |
| 2018/0197586 | A1 | 7/2018 | Nguyen |
| 2019/0043836 | A1 | 2/2019 | Fastow et al. |
| 2019/0066788 | A1 | 2/2019 | Louie |
| 2019/0088335 | A1 | 3/2019 | Hsiung |
| 2020/0006371 | A1 | 1/2020 | Huo et al. |
| 2020/0258817 | A1 | 8/2020 | Okina |
| 2020/0381316 | A1 | 12/2020 | Lee |
| 2020/0402587 | A1 | 12/2020 | Chibvongodze |
| 2021/0065799 | A1* | 3/2021 | Kim .................. G11C 5/025 |
| 2021/0066278 | A1* | 3/2021 | Kim .................. H01L 25/0657 |
| 2021/0233900 | A1* | 7/2021 | Kim .................. H01L 25/0657 |
| 2022/0052010 | A1 | 2/2022 | Goda et al. |

OTHER PUBLICATIONS

PCT International Search Report and Written Opinion dated Apr. 26, 2022, PCT Application No. PCT/US2022/012541.
PCT International Search Report and Written Opinion dated May 11, 2022, PCT Application No. PCT/US2022/012546.

* cited by examiner

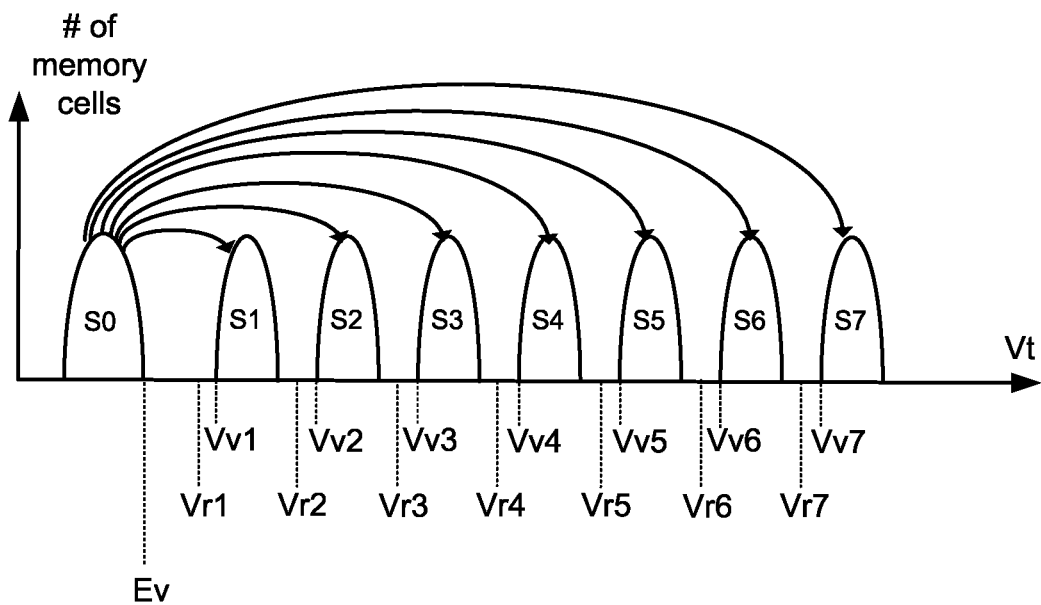

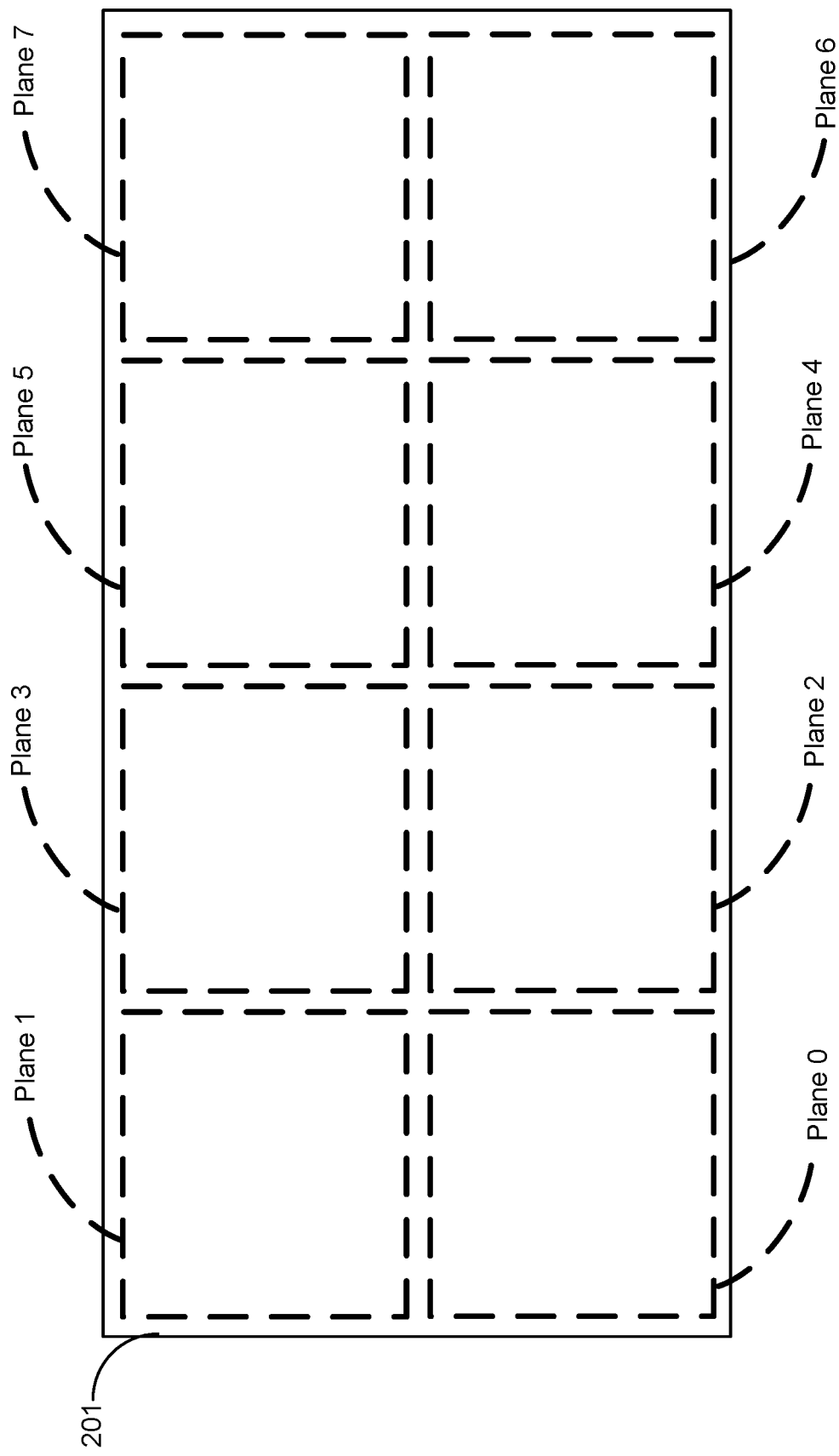

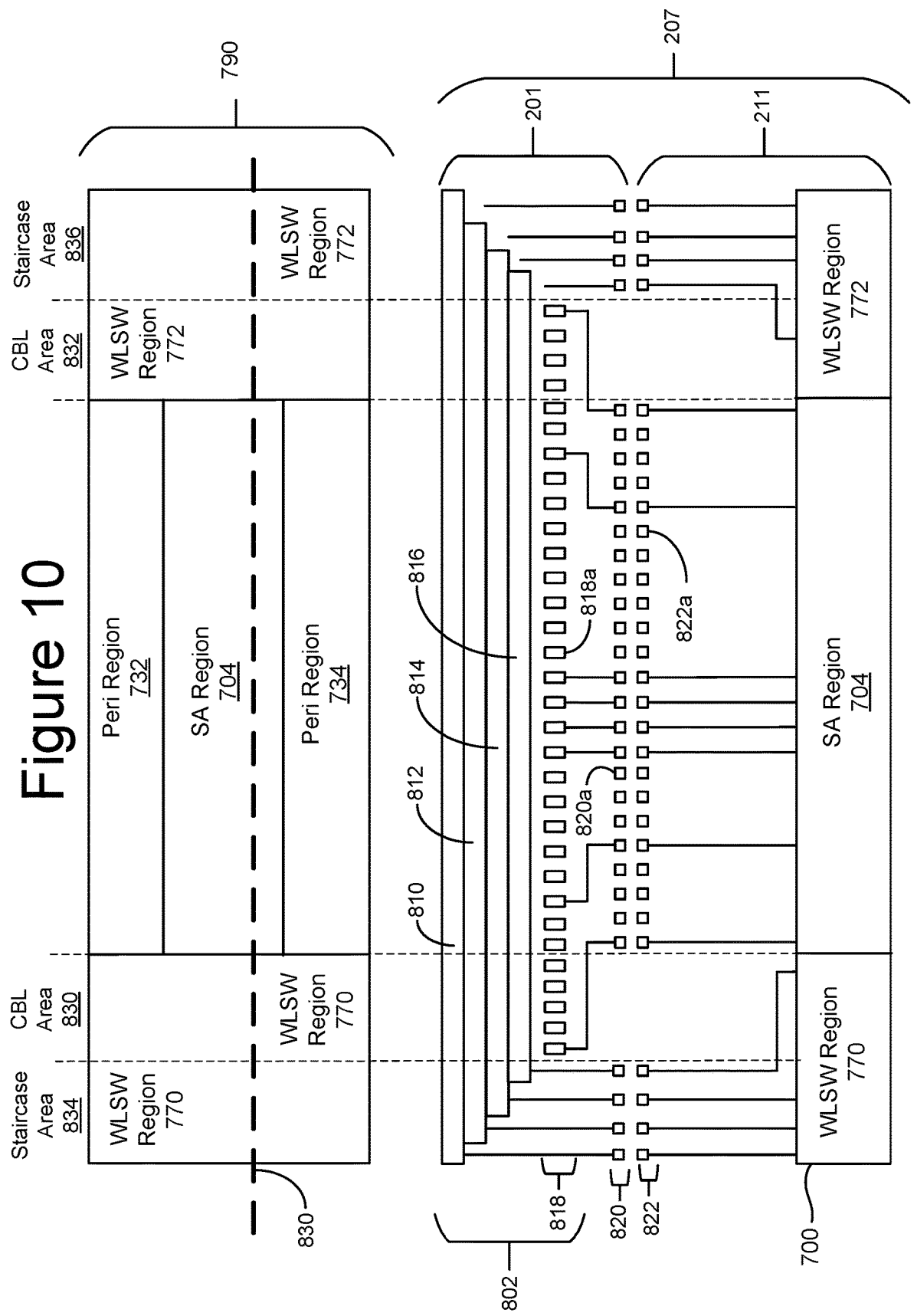

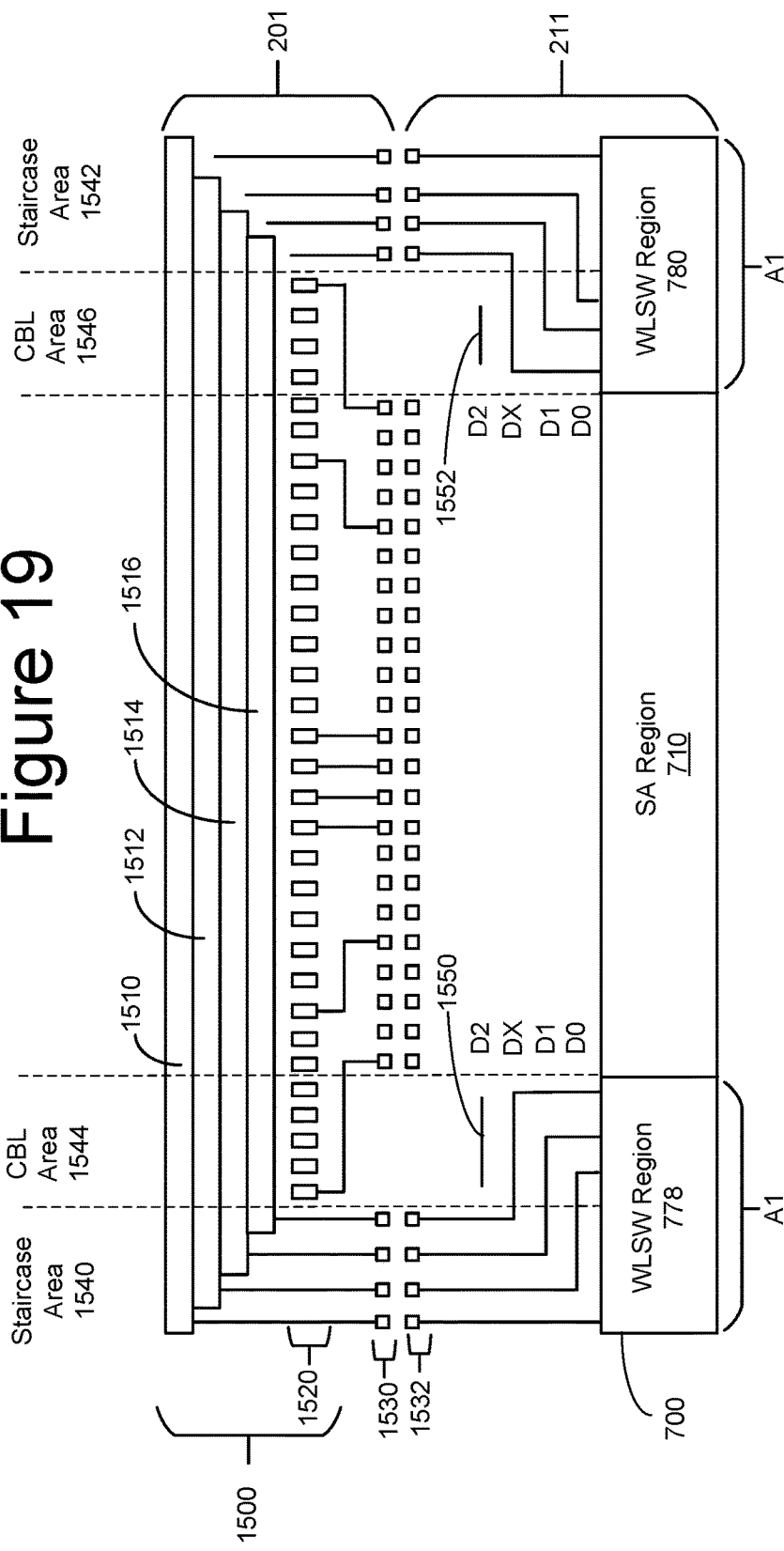

Figure 21

1702: fabricating a memory die comprising multiple planes, each plane includes a three dimensional non-volatile memory array, the memory die includes a first set of bond pads, each of the three dimensional non-volatile memory arrays includes bit lines and word lines connected to non-volatile memory cells, the memory die includes a first metal line layer and a second metal line layer, the first metal line layer is positioned between the second metal line layer and the multiple planes, the second metal line layer is positioned between the first metal line layer and the first set of bond pads, the bit lines are formed in the first metal line layer

1704: above the first set of regions, forming connections in the second metal line layer from the first set of bond pads to the bit lines and without forming connections in the second metal line layer from the first set of bond pads to the word lines

1706: above the second set of regions, forming connections in the second metal line layer from the first set of bond pads to the word lines without forming connections in the second metal line layer from the first set of bond pads to the bit lines

1708: fabricating a control die comprising a second set of bond pads and one or more circuits for controlling the memory die, the one or more control circuits include word line switch transistors and word line hook up signal lines connecting the word line switch transistors with the second set of bond pads, the one or more control circuits further include pass through signal lines that provide electrical connections between components of the control die, regions of the control die below end portions of the planes of the memory die are divided into a first set of regions and a second set of regions

1710: in the first set of regions, forming word line hook up signal lines in the first set of one or more metal line layers, pass through signal lines in the second set of one or more metal line layers, and word line hook up signal lines in the third set of one or more metal line layers

1712: in the second set of regions, forming word line hook up signal lines in the first set of one or more metal line layers, pass through signal lines in the second set of one or more metal line layers, and pass through signal lines in the third set of one or more metal line layers

1714: bonding the control die to the memory die by connecting the first set of bond pads of the memory die to the second set of bond pads of the control die

NON-VOLATILE MEMORY WITH DIFFERENT USE OF METAL LINES IN WORD LINE HOOK UP REGIONS

PRIORITY CLAIM

This application claims priority to U.S. Provisional Application Ser. No. 63/171,073, filed on Apr. 5, 2021, titled "Architecture for Non-Volatile Memory," incorporated herein by reference in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a power source (e.g., a battery). One example of non-volatile memory is flash memory (e.g., NAND-type and NOR-type flash memory).

Programming data into non-volatile memory typically includes applying a program voltage to the control gate of the selected memory cells as a series of voltage pulses that increase in magnitude over time. In one possible approach, the magnitude of the pulses is increased with each successive pulse by a predetermined step size, e.g., 0.2-0.6 volts. In the periods between the program pulses, verify operations are carried out. That is, the programming level of each memory cell of a group of memory cells being programmed in parallel is read between successive programming pulses to determine whether it is equal to or greater than a verify level to which the respective memory cell is being programmed.

For some architectures, thousands of memory cells can be programmed or read at the same time. For example, with a NAND architecture the control gates of thousands of memory cells may be connected together by what is commonly referred to as a word line. Thus, by applying a program voltage to the word line, thousands of memory cells can be programmed concurrently. Likewise, by applying a read voltage to the word line, thousands of memory cells can be read concurrently.

A non-volatile memory may have many word lines, each used as a control line for a different set of memory cells. For some architectures, programming and/or reading is performed on one word line at a time. Typically, this is referred to as the selected word line. Thus, a programming voltage may be applied to the selected word line, and at that same time another one or more voltages that do not program memory cells is/are applied to unselected word lines.

One technique for applying the necessary voltages to the word lines is through word line switch transistors that are connected to each word line. For some techniques, in order to turn on the word line switch transistor to transfer the program voltage to the word line, the gate of the word line switch transistor needs to be biased to at least the program voltage plus the word line switch transistor's threshold voltage. Program voltages may be quite large, thus the needed gate voltage is even larger. To accommodate the large gate voltage, the word line switch transistor must be made larger than would be needed for a smaller gate voltage. As non-volatile memories have become larger, with more word lines and more memory cells, more word line switch transistors are needed. Therefore, word line switch transistors are occupying more space on the semiconductor die.

Word line switch transistors can be positioned directly below the location for connecting to word lines (i.e. word line hook up region). However, as non-volatile memories have become larger resulting in word line switch transistors occupying more space on the semiconductor die, there is not enough room to position all word line switch transistors directly below the word line hook up region without making the non-volatile memories even larger (which is not desired). To compensate, a subset of word line switch transistors can be positioned at a location horizontally offset from the word line hook up region and use horizontal metal lines to connect the subset of word line switch transistors to the corresponding word lines.

The circuits used to control a non-volatile memory typically require signal lines to transfer signals, voltages and/or data between components of the circuits. These signal lines are referred to as pass through signal lines because they pass through portions of the semiconductor die but do not leave the semiconductor die. The pass through signal lines are typically implemented as horizontal metal lines.

A semiconductor die implementing a non-volatile memory typically has a finite limit on the amount of horizontal metal lines. Therefore, as more word line switch transistors are positioned at a location horizontally offset from the word line hook up region and use more horizontal metal lines to connect the subset of word line switch transistors to the corresponding word lines, there may not be enough room on the semiconductor die to implement all of the needed horizontal metal lines to connect the subset of word line switch transistors to the corresponding word lines and the needed horizontal metal lines for pass through signal lines.

One solution to the shortage of area for all of the needed metal lines is to make the semiconductor die larger. However, making the semiconductor die larger increases costs of the memory and may make the memory physically too large for some applications.

BRIEF DESCRIPTION OF THE DRAWINGS

Like-numbered elements refer to common components in the different figures.

FIG. 5 depicts threshold voltage distributions.

FIG. 6 is a table describing one example of an assignment of data values to data states.

FIG. 9 depicts a top view of a memory die.

FIG. 10 shows a portion of a top view of a control die aligned with a cross section of an integrated memory assembly.

FIG. 18 is a table indicating the number of horizontal metal lines that can be used for word line hook ups in various a metal line layers.

FIG. 19 shows a cross section of a portion of an integrated memory assembly.

FIG. 21 is a flow chart describing one embodiment of a process for fabricating an integrated memory assembly.

DETAILED DESCRIPTION

To overcome the above-described shortage of area for all of the needed horizontal metal lines to connect word line switch transistors to the corresponding word lines and for pass through signal lines, it is proposed to implement multiple architectures for the word line hook up regions. For example, some areas of a die will be designed to provide extra horizontal metal lines to connect word line switch transistors to the corresponding word lines and other areas of the die will be designed to provide extra pass through signal lines.

In a first embodiment, the die is divided into sets of regions between planes of the memory based on the amount of pass through signals needed. In a first set of regions that needs more pass through signals, a set of one or more metal lines are used entirely for pass through signal lines. In a second set of regions that needs less pass through signals, the set of one or more metal lines are used for both pass through signal lines and horizontal metal lines to connect word line switch transistors to the corresponding word lines. In another alternative, each of the set of regions can implement a different mix of pass through signal lines and horizontal metal lines to connect word line switch transistors to the corresponding word lines. In some alternatives, more than two sets of regions can be used.

In a second embodiment, the die is divided into sets of regions between planes of the memory based on proximity to various circuit elements. For example, in a first set of regions adjacent (or between) sense amplifiers, a first scheme is used for allocating horizontal metal lines to pass through signals, horizontal metal lines to connect word line switch transistors to the corresponding word lines, and horizontal metal lines to connect sense amplifiers to corresponding bit lines. In a second set of regions that are not adjacent sense amplifiers (e.g., adjacent and/or between other peripheral circuits), a second scheme is used for allocating horizontal metal lines to pass through signals, horizontal metal lines to connect word line switch transistors to the corresponding word lines, and horizontal metal lines to connect sense amplifiers to corresponding bit lines. The first and second embodiments can be implemented together or separately (e.g., only implement one of the first and second embodiments). In some alternatives, more than two sets of regions can be used.

Figure 1:
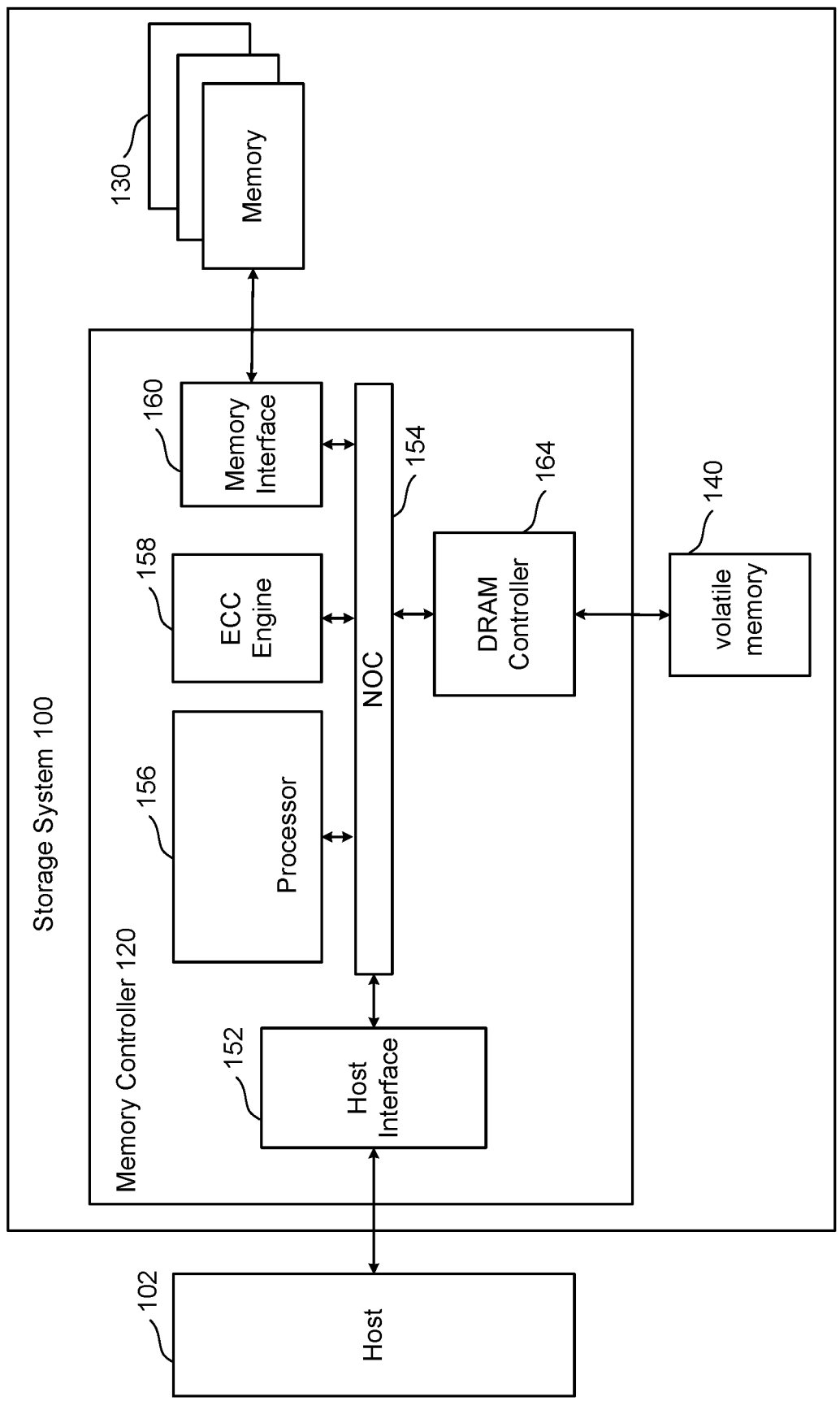
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
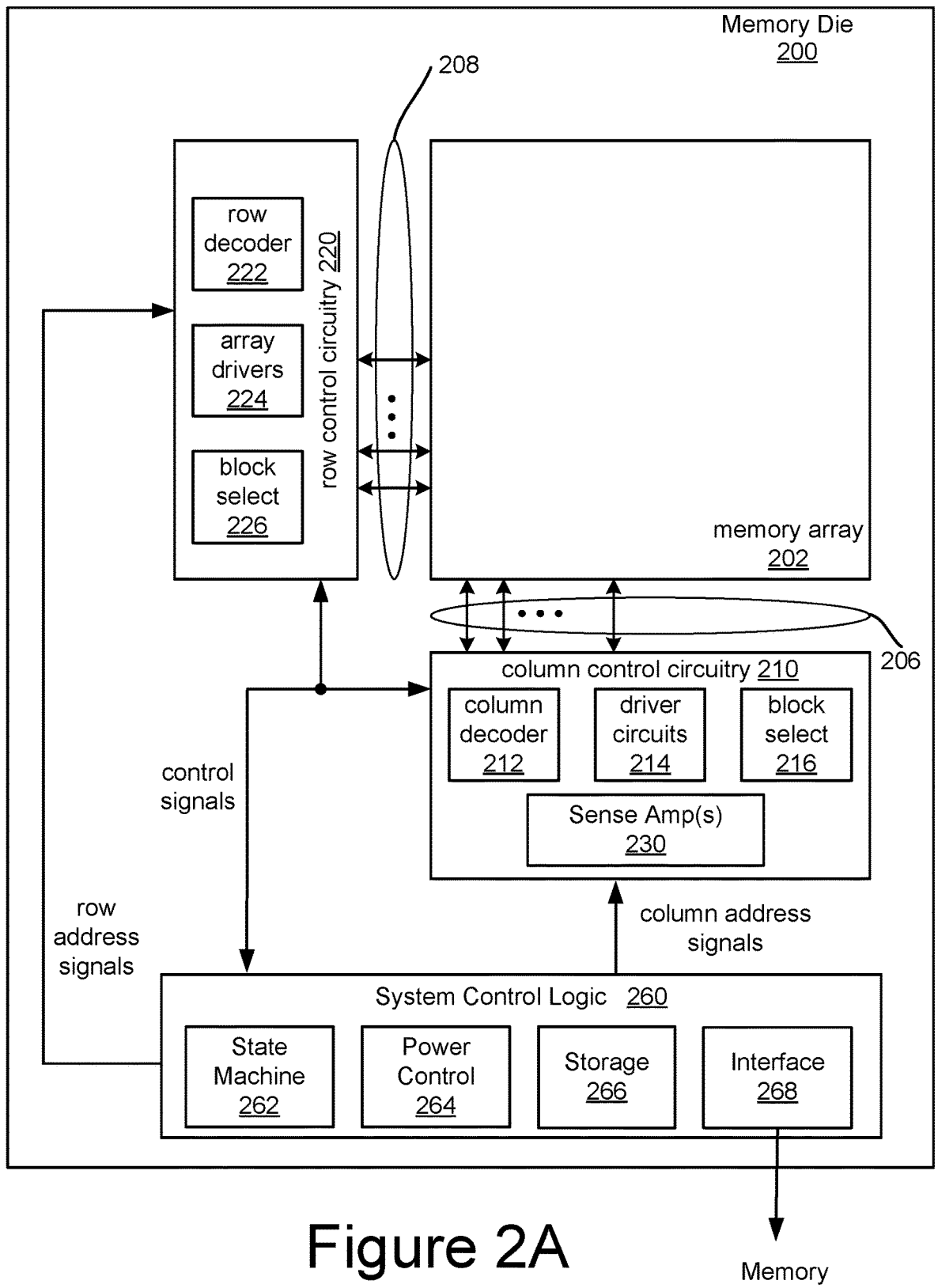
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
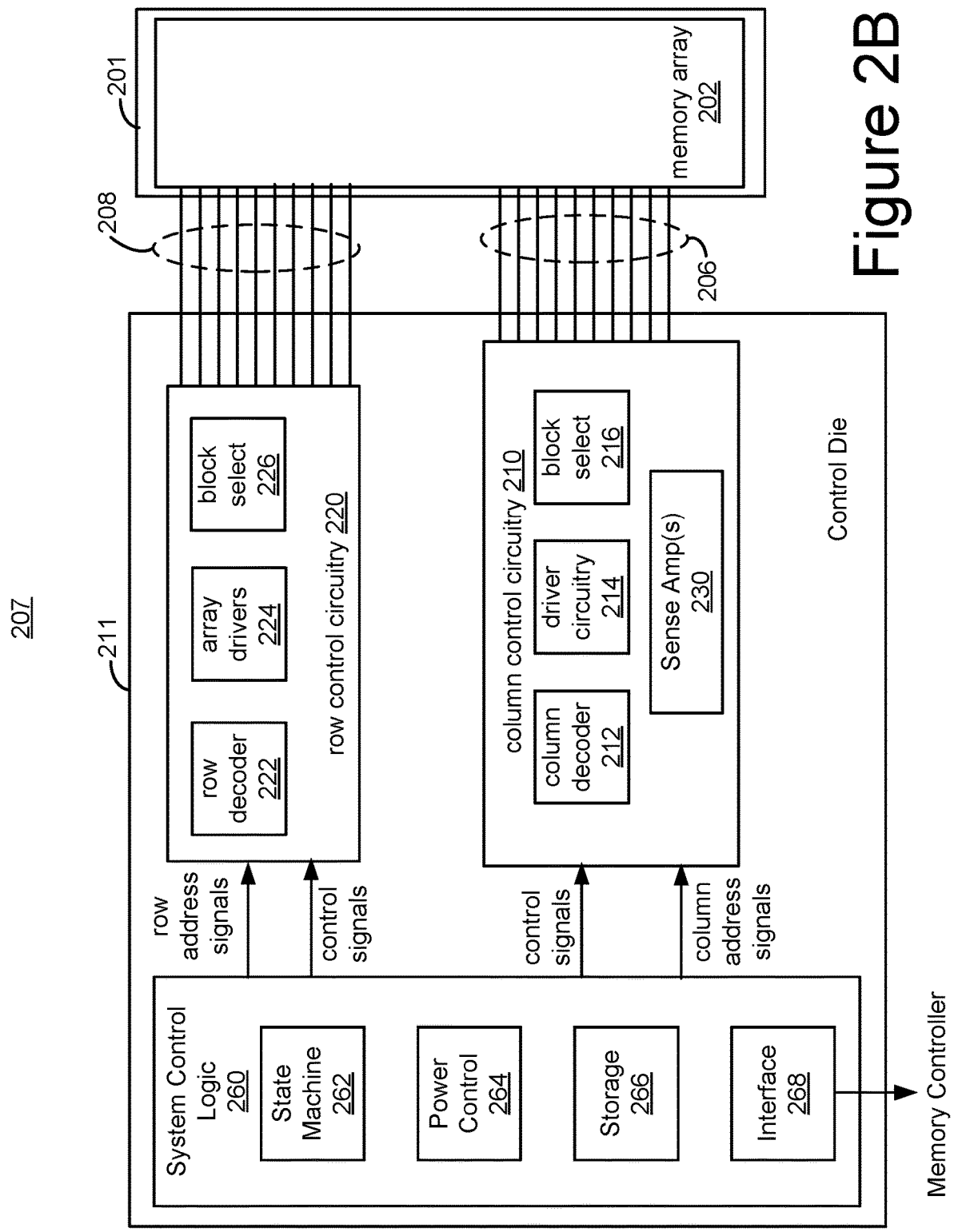
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 307 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 311 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrase "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
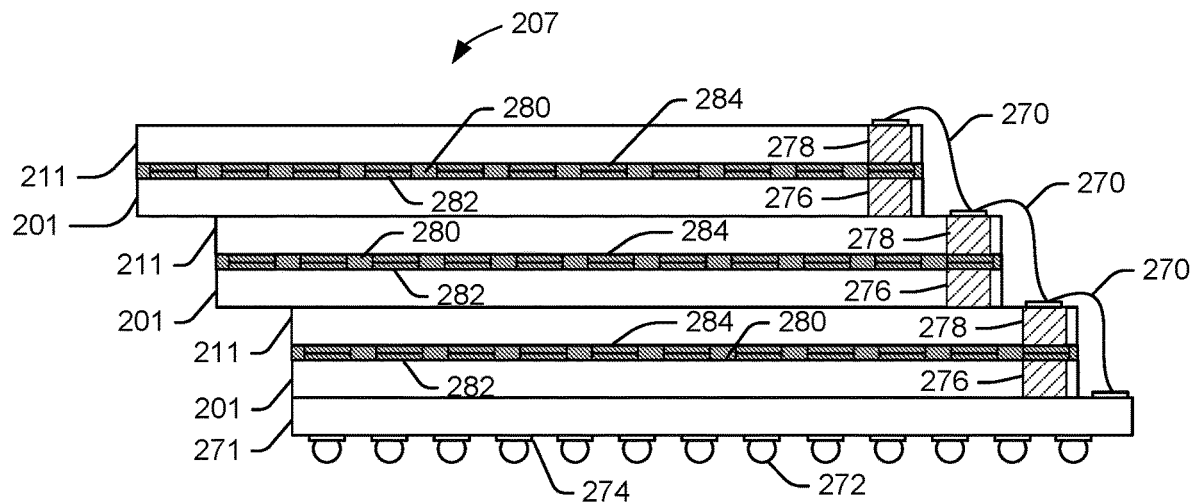
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
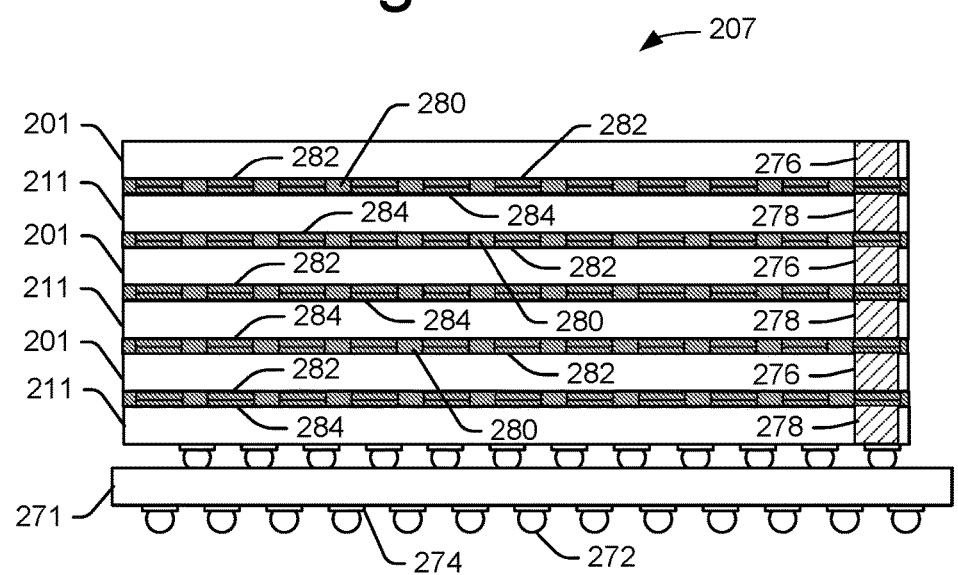

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
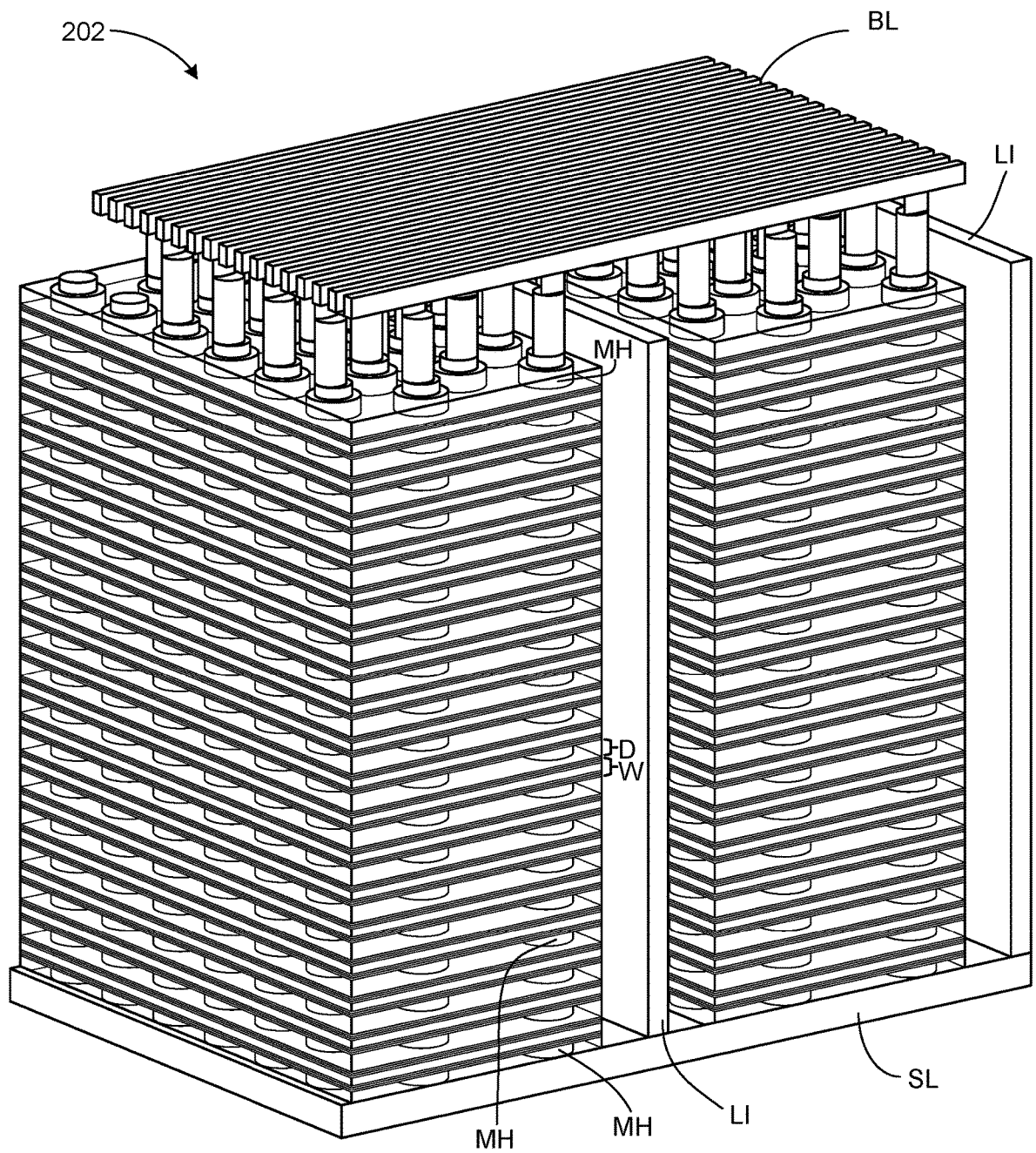
FIG. 3 is a perspective view of a portion of one embodiment of a monolithic three dimensional memory structure.

FIG. 3 is a perspective view of a portion of one example embodiment of a monolithic three dimensional memory array/structure that can comprise memory structure 202, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. More or less than 108-300 layers can also be used. As will be explained below, the alternating dielectric layers and conductive layers are divided into four or more regions (e.g., sub-blocks) by local interconnects LI.

FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below with respect to FIG. 4A-4E.

Figure 4A:
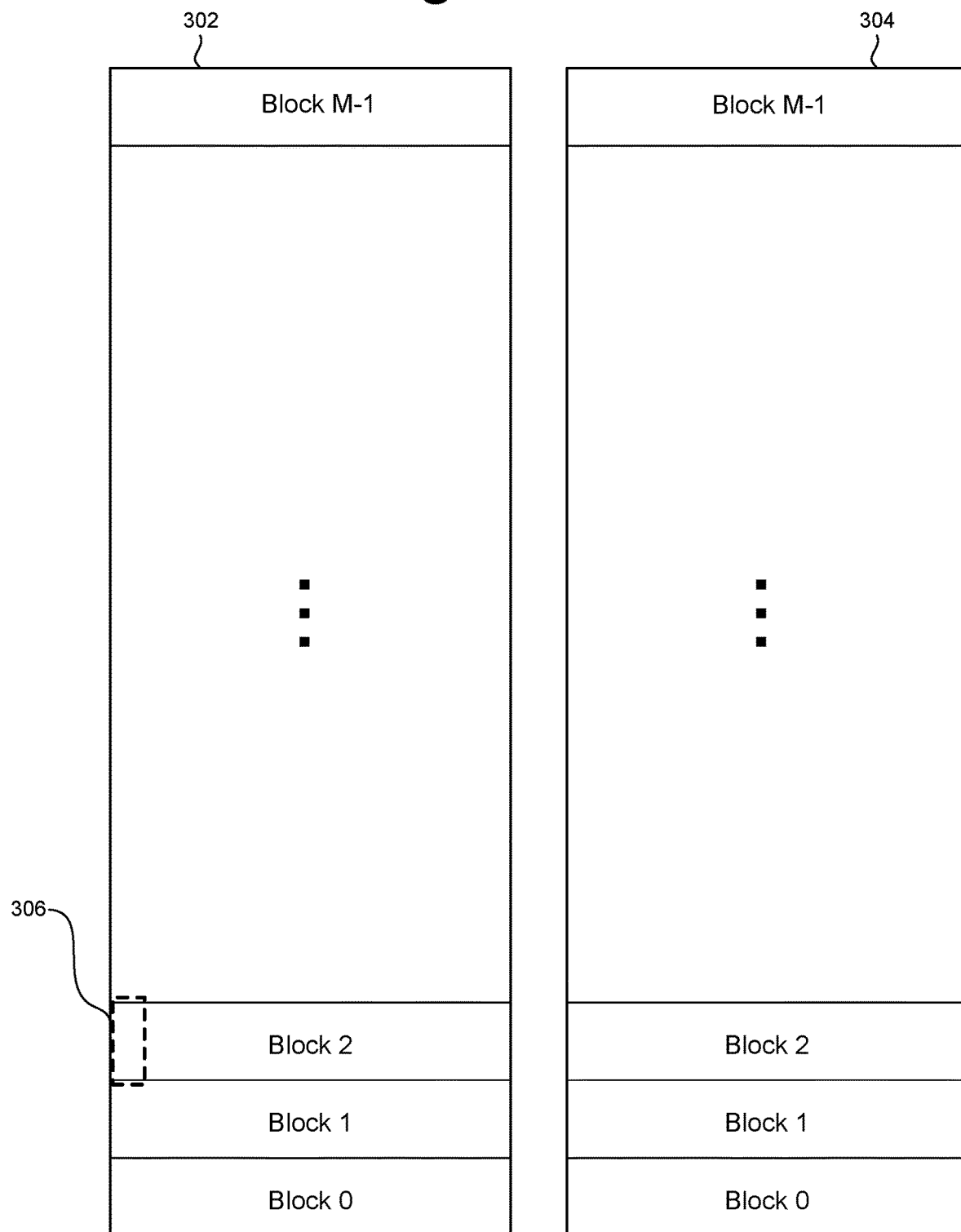
FIG. 4A is a block diagram of a memory structure having two planes.

FIG. 4A is a block diagram explaining one example organization of memory structure 202, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 302/304, more or less than two planes can be implemented. Ion some embodiments, memory structure 202 includes eight planes.

Figure 4B:
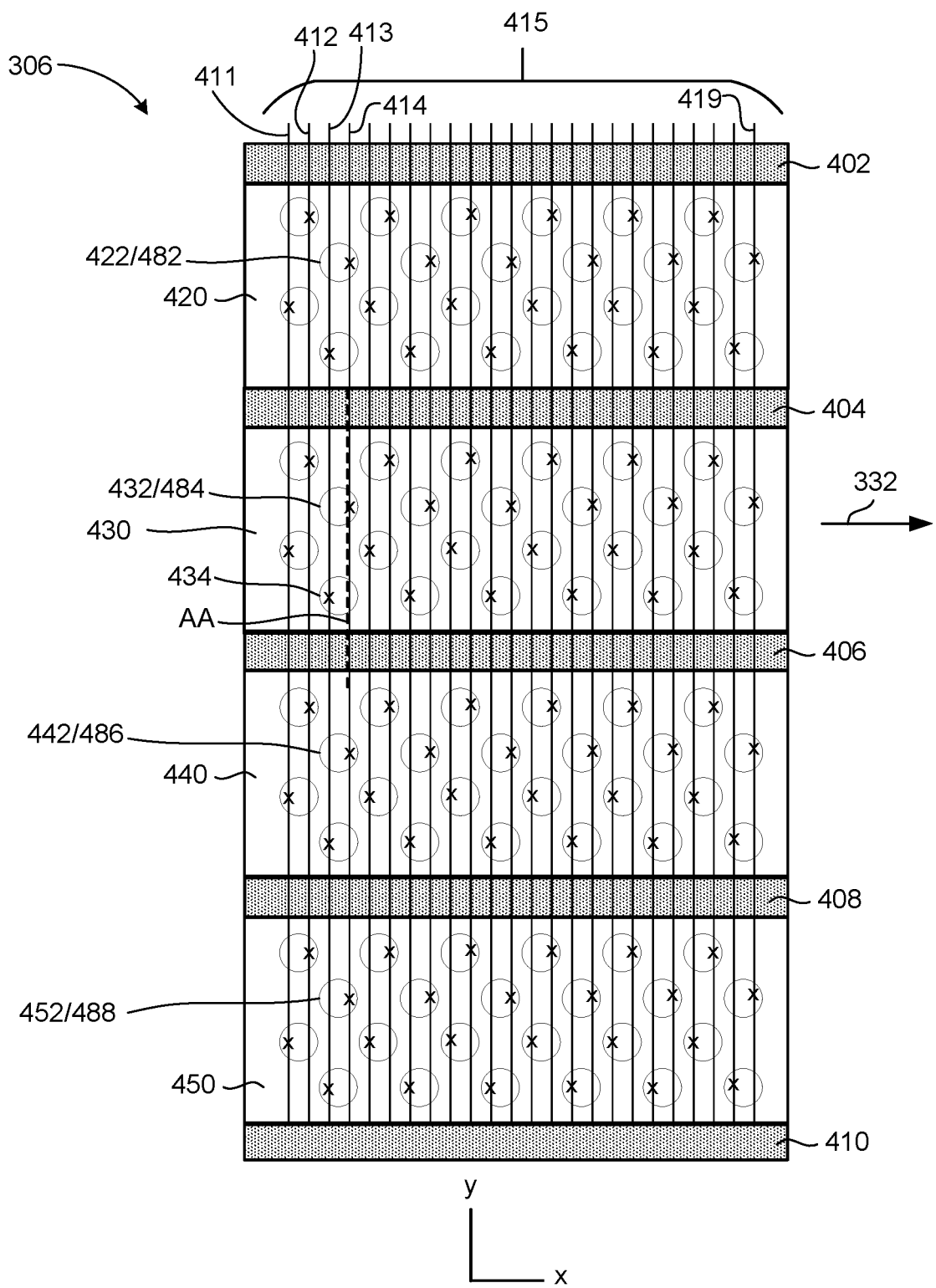
FIG. 4B depicts a top view of a portion of a block of memory cells.

FIGS. 4B-4E depict an example three dimensional ("3D") NAND structure that corresponds to the structure of FIG. 3 and can be used to implement memory structure 202 of FIGS. 2A and 2B. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
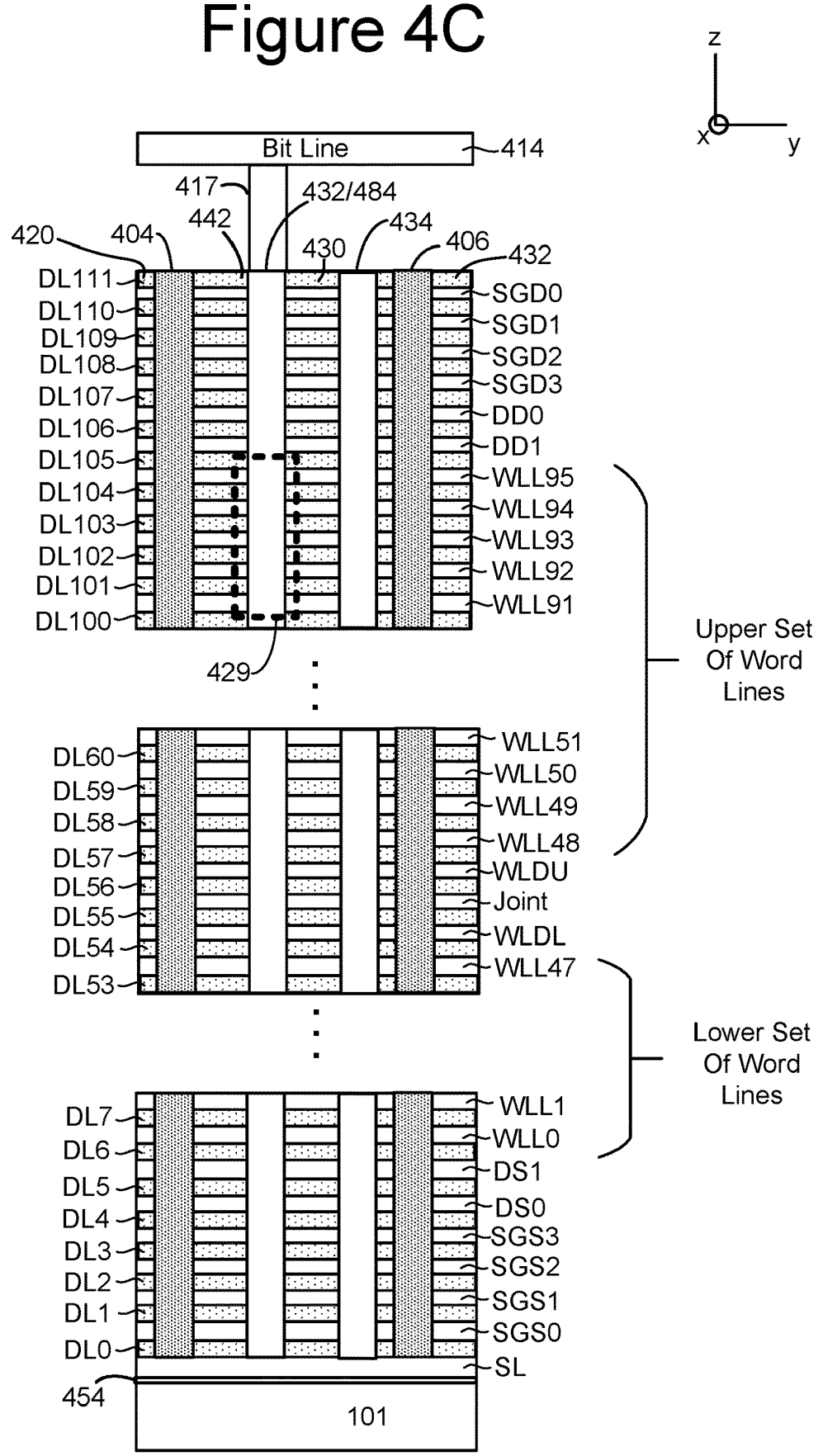
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 417. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and data word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

In one embodiment, drain side select layers SGD0, SGD1, SGD2 and SGD3 drain side selection lines; source side select layers SGS0, SGS1, SGS2 and SGS3 implement source side selection lines; dummy word line layers DD0, DD1, DS0, DS1, WLDL and WLDU implement dummy word lines; and data word line layers WLL0-WLL95 implement data word lines. In one embodiment, data word lines, dummy word lines, drain side selection lines and source side selection lines are all referred to generically as word lines.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (word lines are one example of control lines, bit lines can also be considered control lines) comprises a first stack of alternating word line layers and dielectric layers, a second stack of alternating word line layers and dielectric layers, and a joint area between the first stack and the second stack, as depicted in FIG. 4C.

Figure 4D:
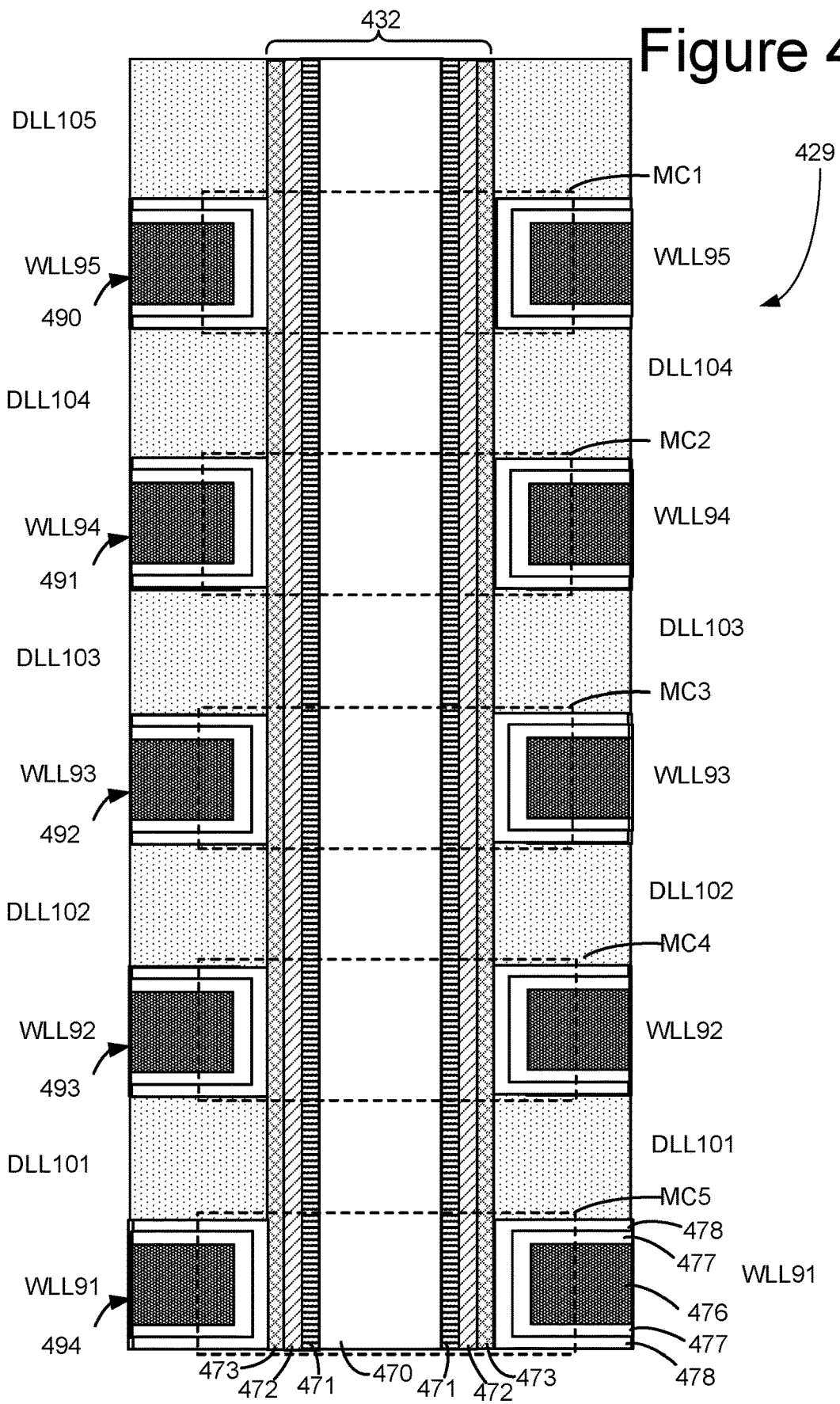
FIG. 4D is a cross sectional view of a vertical column of memory cells.

FIG. 4D depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4D depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. In other embodiments, the blocking oxide layer can be a vertical layer parallel and adjacent to charge trapping layer 473. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4E:
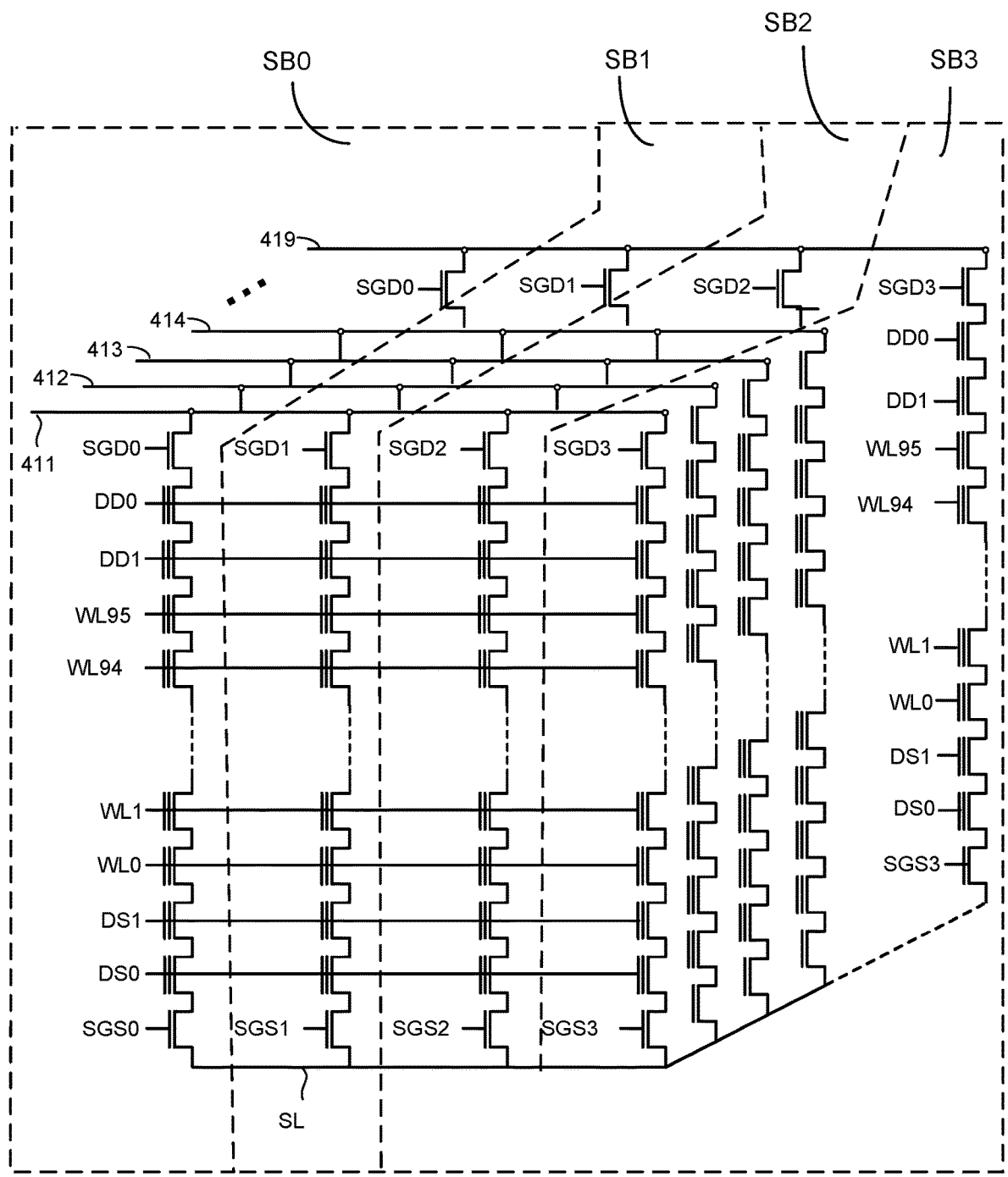
FIG. 4E is a schematic of a plurality of NAND strings showing multiple sub-blocks.

FIG. 4E is a schematic diagram of a portion of the memory depicted in in FIGS. 3-4D. FIG. 4E shows physical data word lines WLL0-WLL95 running across the entire block. The structure of FIG. 4E corresponds to portion 306 in Block 2 of FIGS. 4A-D, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4E is a three dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Ev, Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 7:
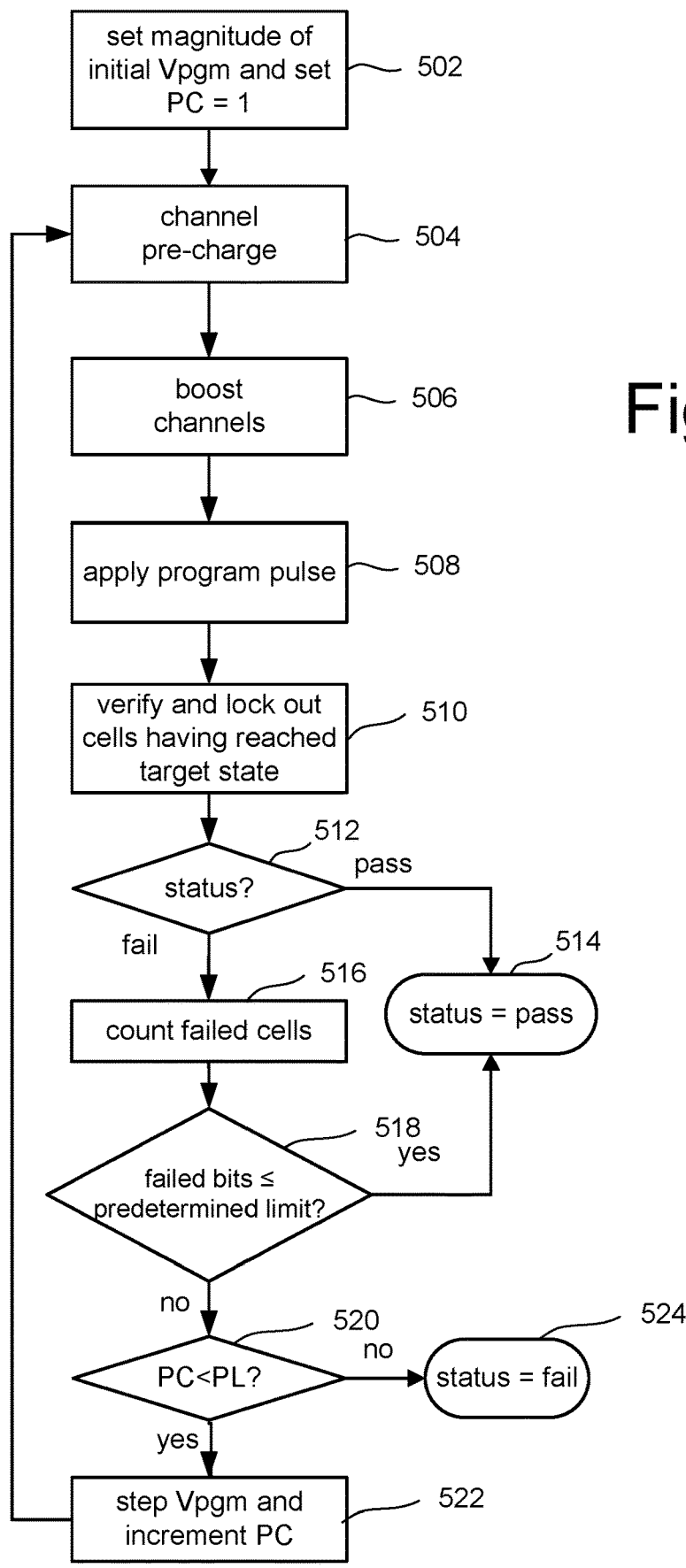
FIG. 7 is a flow chart describing one embodiment of a process for programming non-volatile memory.

FIG. 7 is a flowchart describing one embodiment of a process for programming that is performed by memory die 200 and/or integrated assembly 207. In one example embodiment, the process of FIG. 7 is performed on memory die 200 using the one or more control circuits (e.g., system control logic 260, column control circuitry 210, row control circuitry 220) discussed above. In one example embodiment, the process of FIG. 7 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 7 is performed to implement the full sequence programming, as well as other programming schemes including multi-stage programming. When implementing multi-stage programming, the process of FIG. 7 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 502 of FIG. 7, the program voltage (Vpgm) is initialized to the starting magnitude (e.g., ~12-20V or another suitable level) and a program counter PC maintained by state machine 262 is initialized at 1.

In one embodiment, the set of memory cells selected to be programmed (referred to herein as the selected memory cells) are programmed concurrently and are all connected to the same data word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the storage system will pre-charge channels of NAND strings that include memory cells connected to the selected word line that are to be inhibited from programming. In step 506, NAND strings that include memory cells connected to the selected word line that are to be inhibited from programming have their channels boosted to inhibit programming. Such NAND strings are referred to herein as "unselected NAND strings." In one embodiment, the unselected data word lines receive one or more boosting voltages (e.g., ~7-11 volts) to perform boosting schemes. A program inhibit voltage is applied to the bit lines coupled the unselected NAND string.

In step 508, a program pulse (e.g., voltage pulse) of the program signal Vpgm is applied to the selected word line (the data word line selected for programming). If a memory cell on a NAND string should be programmed, then the corresponding bit line is biased at a program enable voltage, in one embodiment. Herein, such a NAND string is referred to as a "selected NAND string." In step 508, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all the memory cells connected to the selected word line will concurrently have their Vt change, unless they are inhibited from programming.

In step 510, memory cells that have reached their target states are locked out from further programming. Step 510 may include performing verifying at one or more verify reference levels. In one embodiment, the verification process is performed by testing whether the threshold voltages of the memory cells selected for programming have reached the appropriate verify reference voltage.

In step 510, a memory cell may be locked out after the memory cell has been verified (by a test of the Vt) that the memory cell has reached its target state. If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all the memory cells have reached their target threshold voltages (fail), then the programming process continues to step 516.

In step 516, the system counts the number of memory cells that have not yet reached their respective target Vt distribution. That is, the system counts the number of memory cells that have, so far, failed to reach their target state. This counting can be done by the state machine 262, the memory controller 120, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 518, it is determined whether the count from step 516 is less than or equal to a predetermined limit. In one embodiment, the predetermined limit is the number of bits that can be corrected by error correction codes (ECC) during a read process for a page (e.g., the unit of programming and the unit of reading) of memory cells. If the number of failed cells is less than or equal to the predetermined limit, than the programming process can stop and a status of "PASS" is reported in step 514. In this situation, enough memory cells programmed correctly such that the few remaining memory cells that have not been completely programmed can be corrected using ECC during the read process. In some embodiments, the predetermined limit used in step 518 is below the number of bits that can be corrected by error correction codes (ECC) during a read process to allow for future/additional errors. When programming less than all of the memory cells for a page, or comparing a count for only one data state (or less than all states), than the predetermined limit can be a pro-rata (or other) portion of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 520 and the program counter PC is checked against the program limit value (PL). Examples of program limit values include 1, 12, 16, 20 and 30; however, other values can be used. If the program counter PC is not less than the program limit value PL, then the program process is considered to have failed and a status of FAIL is reported in step 524. If the program counter PC is less than the program limit value PL, then the process continues at step 522 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 522, the process loops back to step 504 and another program pulse is applied to the selected word line so that another iteration (steps 504-522) of the programming process of FIG. 7 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, memory controller 120 receives host data (also referred to as user data or data from an entity external to the memory system), also referred to as information bits, that is to be stored non-volatile memory structure 202. The informational bits are represented by the matrix i=[1 0] (note that two bits are used for example purposes only, and many embodiments have code words longer than two bits). An error correction coding process (such as any of the processes mentioned above or below) is implemented by ECC engine 158 of memory controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of memory cells, but they do not need to be applied across multiple pages. The data bits can be mapped to a logical page and stored in memory structure 202 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 8:
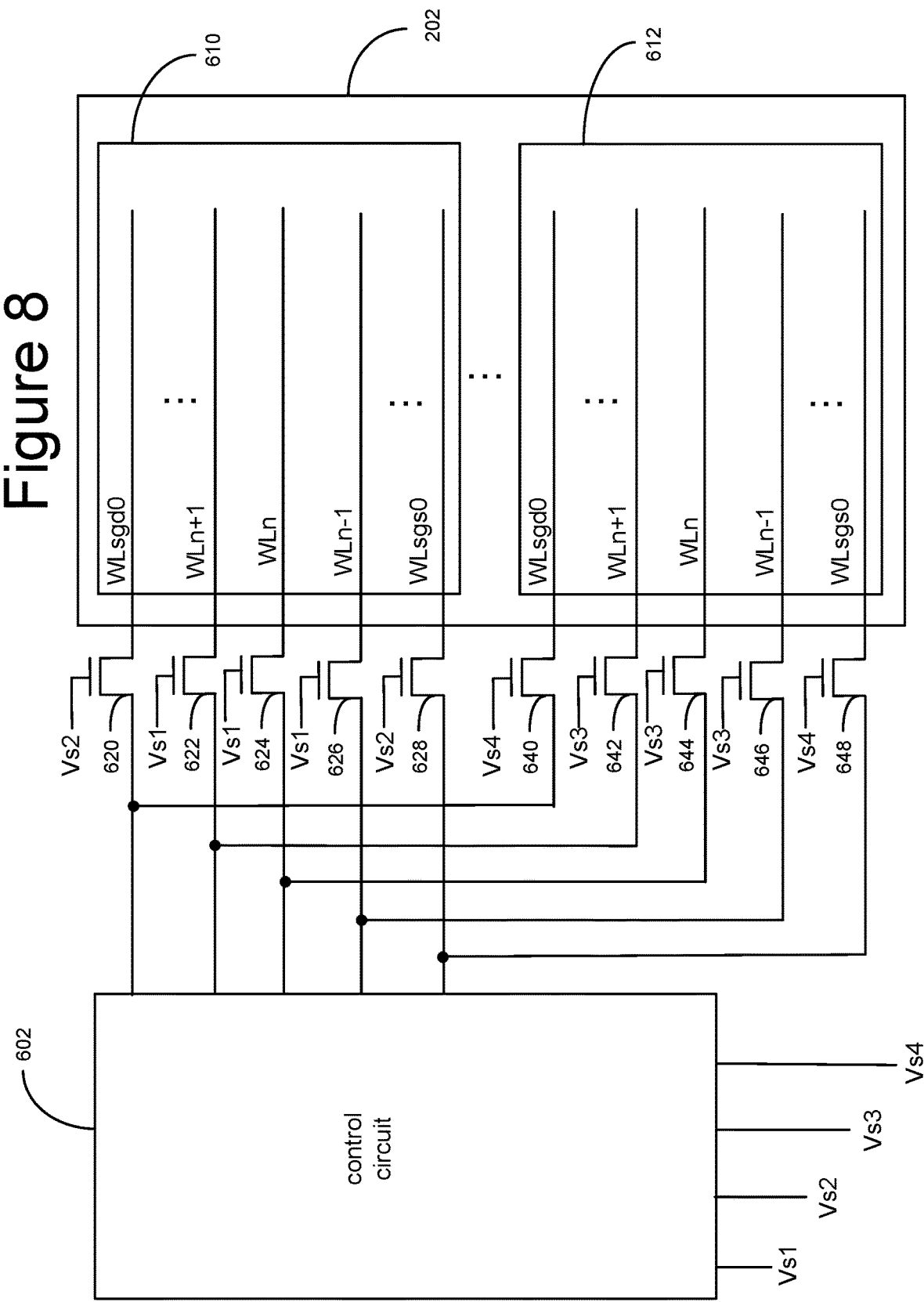
FIG. 8 is a circuit diagram of one embodiment of a portion of a memory system.

FIG. 8 depicts a schematic diagram of control circuit 602 connected to memory array 202. For memory array 202, FIG. 8 shows block 610 and block 612; however, more than two blocks would be included in memory array 202. FIG. 8 only shows two blocks to make the drawing easier to read. Control circuit 602 can be any one or more of the control circuits discussed above. In one embodiment, a portion of control circuit 602 includes the row decoders discussed above. FIG. 8 shows a plurality of word lines extending across the memory. For example, for both blocks 610 and 612, the word line depicted include WLsgs0 . . . WLn−1, WLn, WLn+1, . . . WLsgd0. The other word lines of the blocks are not explicitly depicted to make the drawing easier to read. In addition to row decoders, control circuit 602 includes one or more voltage sources that provide voltage signals which are transferred to the word lines via a plurality of word line switch transistors. For block 610, FIG. 8 shows word lines switch transistor 620 connected to WLsgd0, word line switch transistor 622 connected to WLn+1, word line switch transistor 624 connected to WLn, word line switch transistor 626 connected to WLn 1 and word line switch transistor 628 connected to WLsgs0. For block 812, FIG. 8 shows word line transistor 640 connected to WLsgd0, word line switch transistor 642 connected to WLn+1, word line switch transistor 644 connected to WLn, word line switch transistor 646 connected to WLn−1 and word line switch transistor 648 connected to WLsgs0.

Each of word line transistors 620-648 have their input terminal connected to control circuit 602 for receiving a voltage to be transferred to the respective word lines via the output terminals. Control circuit 602 provides various selection signals (one or more selection voltages or one or more deselect voltages) to the selection terminals of the word line switch transistor. For example, signal Vs1 is provided to word line switches 622, 624, 626; signal Vs2 is provided to word line switches 620 and 628; signal Vs3 is provided to the selection terminal of word line switches 642, 644 and 646, and signal Vs4 is provided to the selection terminals of word line switch transistors 640 and 648. In this manner, the word line switch transistors for a block can be turned on or turned off so that the block is selected or not selected for a particular memory operation. In some embodiment Vs1=Vs2 and Vs3=Vs4.

FIG. 9 depicts a top view of a memory die 201 that includes eight planes: Plane 0, Plane 1, Plane 2, Plane 3, Plane 4, Plane 5, Planer 6 and Plane 7. In other embodiments, more or less than eight planes can be implemented. In one example implementation, each plane includes a three dimensional non-volatile memory array (e.g., as described in FIGS. 4B-4E). Each of the three dimensional non-volatile memory arrays includes bit lines and word lines connected to non-volatile memory cells, as described above.

Figure 9A:
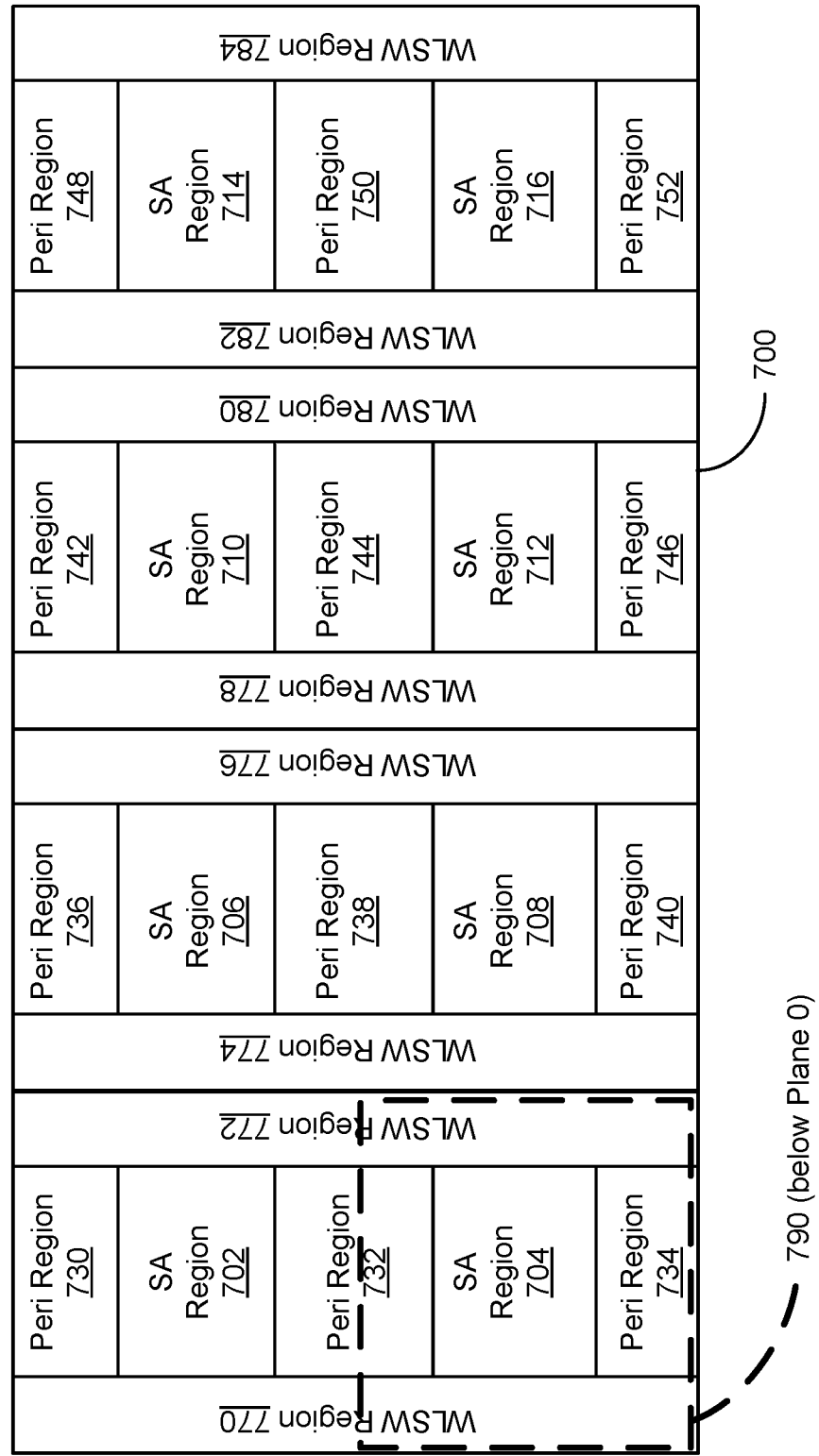
FIG. 9A depicts a top view of a control die.

FIG. 9A depicts a top view of control die 211. Particularly, FIG. 9A is looking down on the top surface of substrate 700 of control die 211. The surface of the substrate is divided into various areas including a plurality of word line switch regions 770, 772, 774, 776, 778, 780, 782 and 784. Each of these word line switch regions includes a plurality of word line switches. Control die 211 also includes a plurality of sense amp regions 702, 704, 706, 708, 710, 712, 714 and 716. Each of the sense amp regions includes sense amplifiers and supporting circuits. Control die 211 further includes a plurality of peripheral circuit regions (also referred to as Peri regions) 730, 732, 734, 736, 738, 740, 742, 744, 746, 748, 750 and 752. Each of the Peri regions includes various peripheral circuits (other than sense amplifiers and word line switch transistors) used to implement control die 211. For example, Peri regions 730, 732, 734, 736, 738, 740, 742, 744, 746, 748, 750 and 752 could include the components of system control logic 260, components of row control circuitry 220, and/or the components of column control circuitry 210 (except for sense amps 230) (see FIG. 2A and FIG. 2B). In the embodiment of FIGS. 2B, 2C, and 2D, control die 211 of FIG. 9A is positioned below memory die 201. That is, the eight planes depicted in FIG. 9 would be positioned above the components depicted in FIG. 9A. Note that FIG. 9A includes a dashed line surrounding section 790 of control die 211 that is positioned below plane zero (see FIG. 9). Section 790 includes word line switch regions 770 and 772, sense amplifier region 704, Peri region 732, and Peri region 734.

FIG. 10 shows a top view of section 790 of control die 211 aligned with a cross section of integrated assembly 207 (including a portion of memory die 201 and a portion of control die 211) along line 830 of section 790. he portion of control die 211 is the same portion 790 depicted in the top portion of FIG. 10 and includes word line switch region 770, word line switch region 772 and sense amp region 704. Note that for purposes of this document, terms relating to orientation with respect to the integrated memory assembly 207 are relative to the semiconductor dies. For example, regardless of whether integrated memory assembly 207 is in the orientation depicted in FIG. 10, flipped vertically or rotated, memory die 201 is above control die 211.

The portion of memory die 201 depicted in the cross section on the bottom of FIG. 10 includes a non-volatile memory array 802 forming plane zero, includes a plurality of word lines 810, 812, 814 and 816. Only four word lines are depicted to make the drawing easier to read; however, in most embodiments more than four word lines would be implemented (as discussed above). To make the drawing easier to read, FIG. 10 does not show the dielectric regions between the word lines or the memory holes. Below the word lines are a plurality of bit lines 818 (e.g., one of the bit lines is labeled 818a for example purposes). Below bit lines 818 are a set of bond pads 820 for memory die 201 (e.g., one of the bond pads is labeled 820a for example purposes). In one embodiment below the memory array word lines and above the bond pads are two metal line layers referred to as M1 and M2. More details of those metal lines will be discussed below.

Control die 211 includes substrate 700. The portion of substrate 700 depicted in FIG. 10 includes word line switch region 770, word line switch region 772, and sense amplifier region 704. Control die 211 also includes a plurality of bond pads 822 (e.g., one of the bond pads is labeled 822a for example purposes) that line up with bond pads 820 in order to bond control die 211 to control die 201. That is, in one embodiment, each (or a subset) of bond pads 822 is bonded to a corresponding and aligned bond pad of plurality bond pads 820. Below bond pads 822 and above substrate 700 are a plurality of metal line layers, which will be discussed in more detail below.

As can be seen from FIG. 10, the word lines (810, 812, 814, 816) are arranged in an inverted staircase structure such that word line length increases from bottom to top of the three dimensional non-volatile memory structure. For example, the two ends of the stack of word lines (810, 812, 814, 816) are in the shape of an inverted staircase. This portion of where the staircases are positioned are referred to as staircase areas, which in FIG. 10 includes staircase area 834 and staircase area 836. FIG. 10 shows how the staircase areas line up over the word line switch regions. Staircase areas 834 and 836 can also be referred to as word line hook up regions because control die 211 will send signals that connect to the word lines in these word line hook up regions/staircase areas 834/836. As can be seen, the staircase areas 834/836 are at end portions of the memory array. Thus, the word line switch regions 770/772 are positioned below the staircase areas, below the word line hook up regions, below end portions of the memory arrays, as well as below and between the planes (see FIG. 9A).

Figure 11:
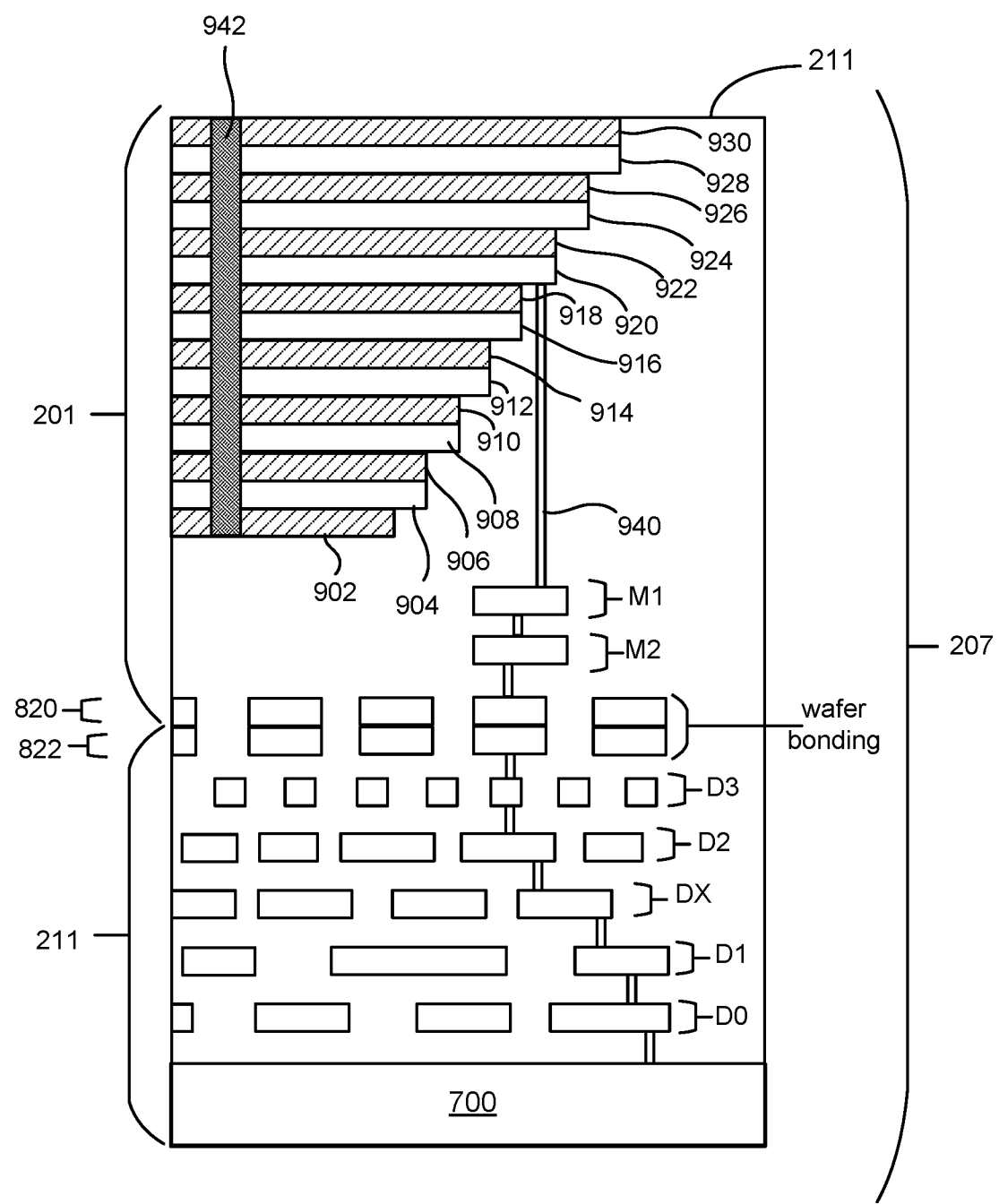
FIG. 11 shows a portion of a cross section of an integrated memory assembly.

FIG. 11 depicts another cross section of memory assembly 207. As can be seen, integrated memory assembly 207 includes memory die 201 bonded to control die 211 via bond pads 820 and 822. Memory die 211 includes a memory array comprising a plurality of word lines 904, 908, 912, 916, 920, 924 and 928 (more word lines are depicted than in FIG. 10). Although seven word lines are depicted in FIG. 11, most embodiments will include more than seven word lines. Between the word line layers are dielectric layers 902, 906, 910, 914, 918, 922, 926 and 930. FIG. 11 shows that below the memory array and above the bond pads 820, memory die 201 includes two metal line layers M1 and M2. In other embodiments more than two metal line layers can be used. As depicted in FIG. 11, metal line layer M2 is below metal line layer M1 such that metal line layer M2 is between metal line layer M1 and bottom pads 820. Similarly, metal line layer M1 is between the memory array and metal line layer M2. Metal line layers M1 and M2 are horizontal metal line layers. FIG. 11 also shows control die 211 including five metal line layers above substrate 700 and below bond pads 822. For example, FIG. 11 shows a bottom metal line layer D0. Above metal line layer D0 is metal line layer D1. Above metal line layer D1 is metal line layer DX. Above metal line layer DX is metal line layer D2. Above metal line layer D2 is metal line layer D3. In one embodiment, metal line layer D3 is a vertical metal line layer and metal line layers D0/D1/DX/D2 are horizontal metal line layers.

Looking back at FIG. 10, the width of word line switch regions 770 is wider than corresponding staircase area 834, and the width of word line switch regions 772 is wider than corresponding staircase area 836. That is because, as described above, there is not enough room to position all word line switch transistors directly below the word line hook up regions of the staircase areas (e.g., 834/836). To compensate, a subset of word line switch transistors can be positioned in word line switch region 770 but horizontally offset from staircase areas 834/836. The area that is horizontally offset from staircase area 834 is referred to as CBL area 830 and the area that is horizontally offset from staircase area 836 is referred to as CBL area 832. Thus, a subset of word line switch transistors that will be positioned in word line switch region 770 will be located in CBL area 830 and a subset of word line switch transistors that will be positioned in word line switch region 772 will be located in CBL area 832. Those word line switch transistors in CBL area 830/832 will need to be connected to metal lines in metal line layers D0/D1/DX/D2 to form horizontal connections to vertical lines or vias that connect to the bond pads 822 below staircase areas 834/836. As more word line switch transistors are positioned in CBL areas 830/832 (horizontally offset from staircase area 834/836), there may not be enough room on control die 211 to implement all the needed horizontal metal lines in D0/D1/DX/D2 to implement all the needed horizontal metal lines that connect the word line switch transistors to the corresponding bond pads (and then to the corresponding word lines) and to implement any needed pass through signals for control die 211. One solution to this shortage of area is to make control die 211 and memory die 201 larger. However, making the dies larger increases cost and may make the dies physically too large for some applications.

To overcome the above-described shortage of area for the needed metal lines, it is proposed to implement multiple architectures for the word line hook up regions (staircase areas). For example, some areas of control die 211 and/or memory die 201 will be designed to provide extra horizontal metal lines to connect word line switch transistors to corresponding word lines and other areas of control die 211 and/or memory die 201 will be designed to provide extra pass through signal lines. In a first embodiment, depicted in FIGS. 12-16, the control die 211 is divided into regions between planes of the memory die 201 based on the amount of pass through signals needed. In a first set of regions that need more pass through signals, a particular set of one or more signal lines are used entirely for pass through signals. In a second the of regions that need less pass through signals, the particular set of one or more metal signal lines are used for both pass through signal lines and horizontal metal lines to connect word line switch transistors to the corresponding word lines. In another alternative, each of the set of regions can implement a different mix of pass through signals and horizontal metal lines to connect word line switch transistors to corresponding word lines.

Figure 12:
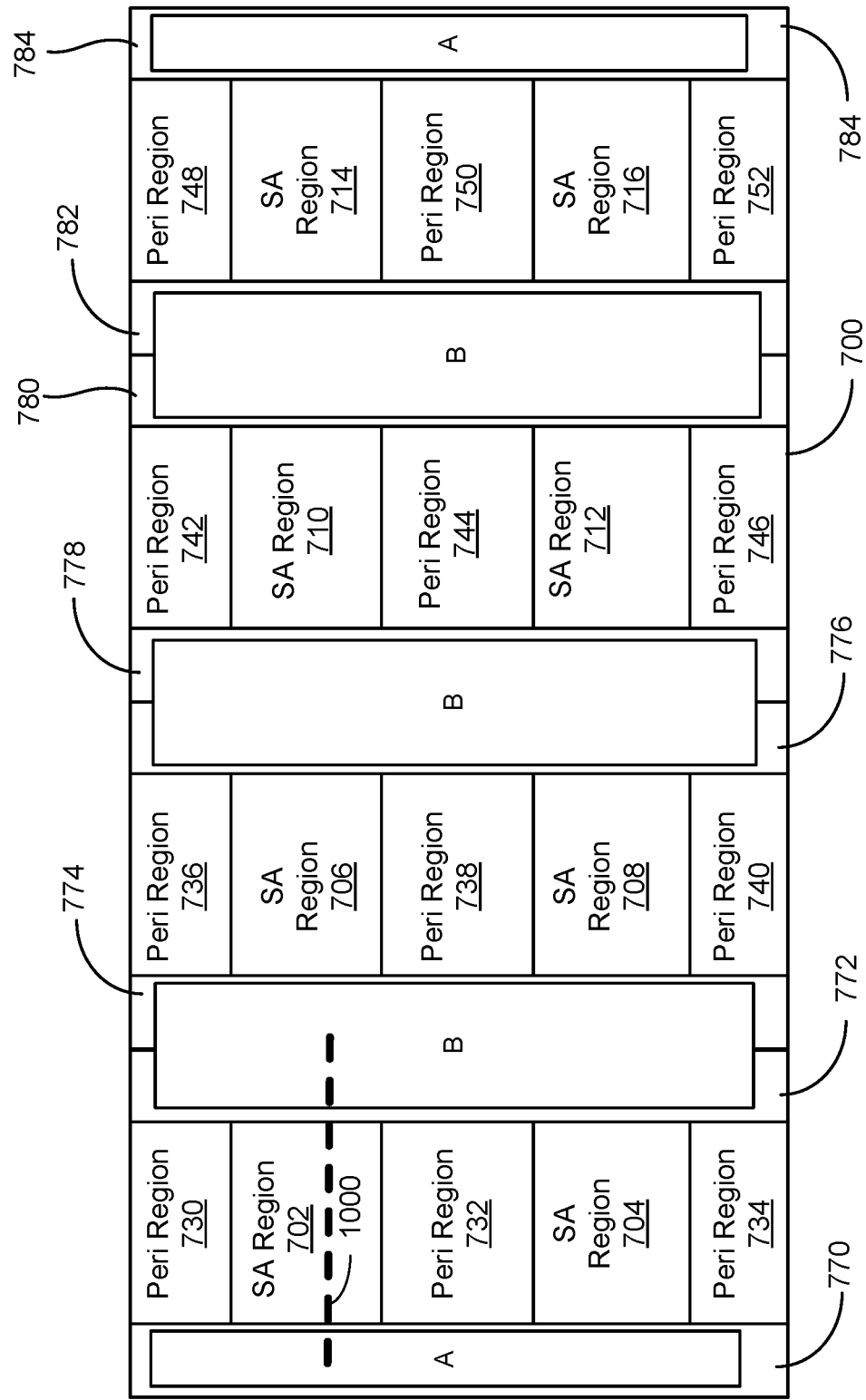
FIG. 12 depicts a top view of a control die.

FIG. 12 depicts a top view of control die 211. The components of FIG. 12 are the same as the components depicted FIG. 9A. That is, control die 211 includes sense amplifier regions 702, 704, 706, 708, 710, 712, 714 and 716; Peri regions 730, 732, 734, 736, 738, 740, 742, 744, 746, 748, 750 and 752; and word line switch region 770, 772, 774, 776, 778, 780, 782 and 784. In the embodiment of FIG. 12, portions of the control die 211 are divided into sets of regions. For example, FIG. 12 shows a plurality of regions labeled A (set of regions) and a plurality of regions labeled B (se of regions). In the portion of control die 211 depicted in FIG. 12, the set of regions A includes two regions depicted in FIG. 12 and the set of regions B includes three regions depicted in FIG. 12; however, in other embodiments more or less than two or three regions can be included. Regions A and B correspond to word line switch regions 770-784, which are below the word line hook up regions, below end portions of the memory arrays, and below and between the various planes (as discussed above). In one embodiment, the reason that the word line switch regions are divided into regions A and regions B are because regions A need less pass through signals than regions B. Alternatively said, regions B need more pass through signals than regions A. Therefore, the architecture for using the various metal line layers in regions A can be different than the architecture used for implementing the various metal lines of region B. For example, the architecture for implementing the metal lines of region A can provide more metal line layers for word line hook up signals lines than in region B while the architecture for implementing the metal line layers in region B can provide for more pass through signal lines than the architecture for regions A. As discussed above, the metal lines used for word line hook up signals will connect word line switch transistors to word lines via the bond pads, and the pass through signals will provide electrical connections between components of the one or more circuits of control die 211. In one embodiment, pass through signs remain on control die 211 and are not transmitted to memory die 201.

Figure 13:
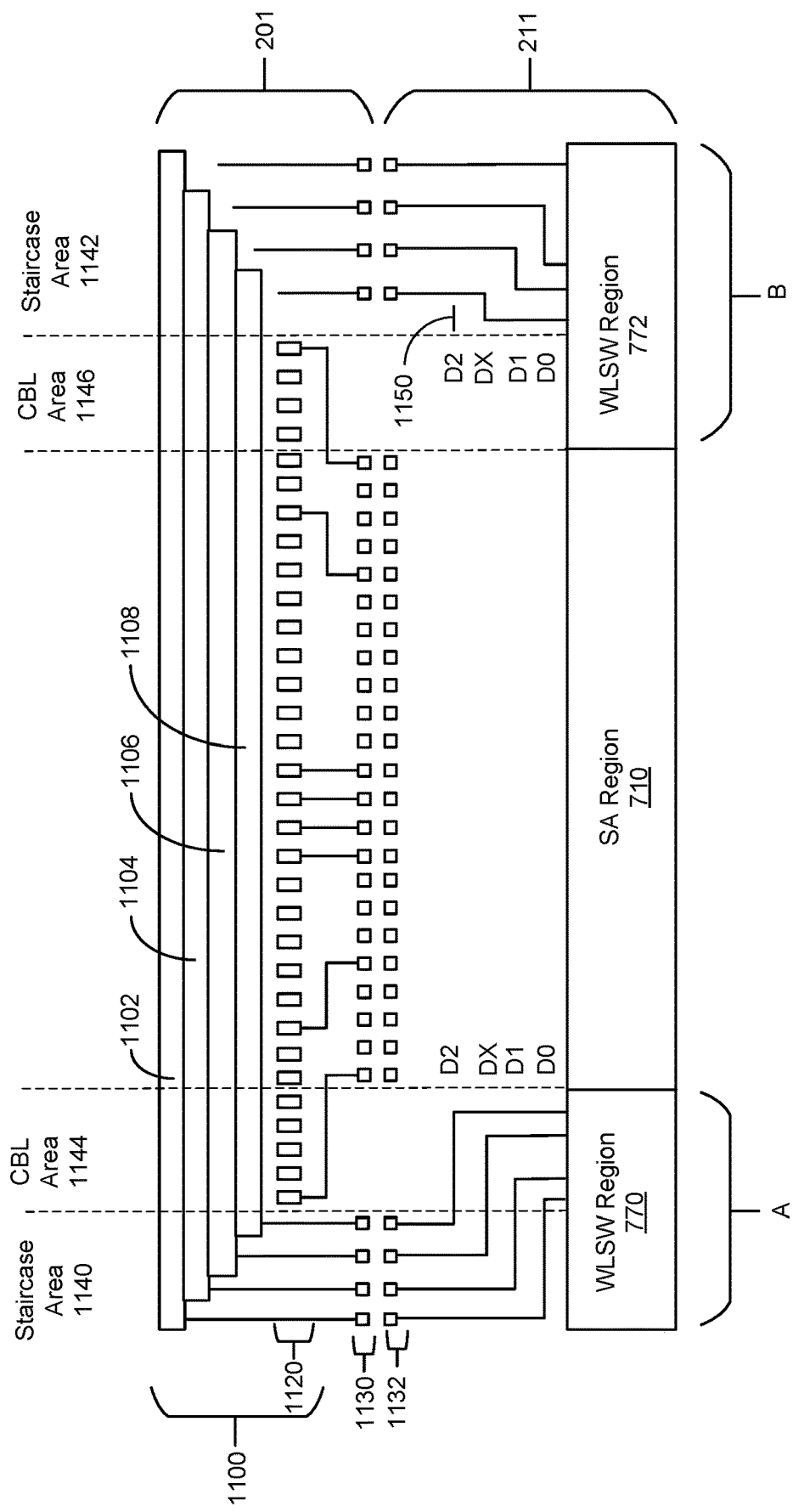
FIG. 13 shows a cross section of a portion of an integrated memory assembly.

FIG. 13 shows a cross section of a portion of an integrated memory assembly 211 across line 1000 of FIG. 12. The cross section of FIG. 13 shows word line switch region 770, word line switch region 772 and sense amplifier region 710 of control die 211. FIG. 13 also shows a portion of metal line layers D0, D1, DX and D2. Control die 211 includes a plurality of bond pads 1132 that are aligned to and bonded to plurality of bond pads 1130 of memory die 201. Memory die 201 includes memory array 1100, which includes four word line lines 1102, 1104, 1106 and 1108. Only four word lines are depicted to make the drawing easier to read, but in most embodiments more than four word lines will be implemented. Also to make the drawings simpler, the dielectric regions and memory holes are omitted. Below the word lines are a plurality of bit lines 1120. In one embodiment, the bit lines are implemented in metal line layer M1. FIG. 13 shows a subset of connections between the bit lines 1120 and bond pads 1130. Only a subset of connections are depicted to make the drawing easier to read, but all bit lines would be connected at some point to at least one bond pad. Some bit lines line up directly above a bond pad so that only vertical signal lines are used. Other bit lines need horizontal signal lines to connect to a bond pad. Those horizontal signal lines are implemented in metal line layer M2.

In the embodiment of FIG. 13, word line switch region 770 is part of a region A and word line switch region 772 is part of a region B. In one embodiment, both region A and region B will have the same hook ups of bond pads 1130 to word lines. Additionally, both regions A and B will use metal line layers D0, D1 and DX for word line hook up signal lines. That is, metal line layers D0, D1 and DX will be used to connect word line switch transistors of word line switch transistor regions 770 and 772 to bond pads 1132 (and then to word lines). A difference between regions A and regions B is that in regions B metal signal line layer D2 is used for pass through signals only. That is, in one embodiment, 100% of metal line layer D2 will be used for pass through signals for region B. In region A, metal line layer D2 will be used for both pass through signals and word line hook up signals. This allows for extra horizontal lines for word line hook up signal lines in regions A; therefore, more word line switches can be placed in CBL area 1144 as opposed to CBL area 1146. Because region B can position less word line switch transistors in CBL area 1146, staircase area 1142 has to be larger to accommodate the extra word line switch transistors. Alternatively said, because of this architecture, staircase area 1140 of the memory array 1100 and the memory die 201 can be made smaller. This difference in architecture is graphically depicted in FIG. 13 as FIG. 13 shows that in region A metal line layers D0, D1, DX and D2 are used for connecting word line switch transistors of word line switch region 770 to bond pads 1132 while in region B metal line layers D0, D1 and DX are used to connect word line switch transistors of word line switch region 772 to bond pads 1132. Metal line layer D2 is not used to connect word line switch transistors of word line switch region 772 to bond pads 1132. Note that in one embodiment, the components of FIG. 13 implement two separate dies: memory die 201 and control die 211. In another embodiment, the components of FIG. 13 can all be part of one die where the memory arrays formed above the various one or more control circuits.

As can be seen from FIG. 13, the word lines (1102, 1104, 1106, 1108) are arranged in an inverted staircase structure such that word line length increases from bottom to top of the three dimensional non-volatile memory structure. For example, the two ends of the stack of word lines (1102, 1104, 1106, 1108) are in the shape of an inverted staircase. This portion of where the staircases are positioned are referred to as staircase areas, which in FIG. 13 includes staircase area 1140 and staircase area 1142. FIG. 10 shows how the staircase areas line up over the word line switch regions. Staircase areas 1140 and 1142 can also be referred to as word line hook up regions because control die 211 will send signals that connect to the word lines in these word line hook up regions/staircase areas 1140/1142. As can be seen, the staircase areas 1140/1142 are at end portions of the memory array. Thus, the word line switch regions 770/772 are positioned below the staircase areas, below the word line hook up regions, below end portions of the memory arrays, as well as below and between the planes (see FIG. 9A). CBL areas 1144/1146 are similar to CBL areas 830/832.

FIG. 13 shows that for memory array 1100, the inverted staircase of staircase area 1142 (region B) is wider than the inverted staircase for staircase area 1140 (region A), which highlights how the use of metal line layer D2 for word line hook up signal lines between bond pads 1132 in staircase area 1140 and word line switch transistors on CBL area 1144 can results in a smaller memory die.

Note that the word line hook up lines in memory die 201 within staircase area 1142 are not shown connected to the word lines because not all word lines are depicted. But in an actual embodiment those word line hook up lines would be connected to actual word lines.

Figure 14:
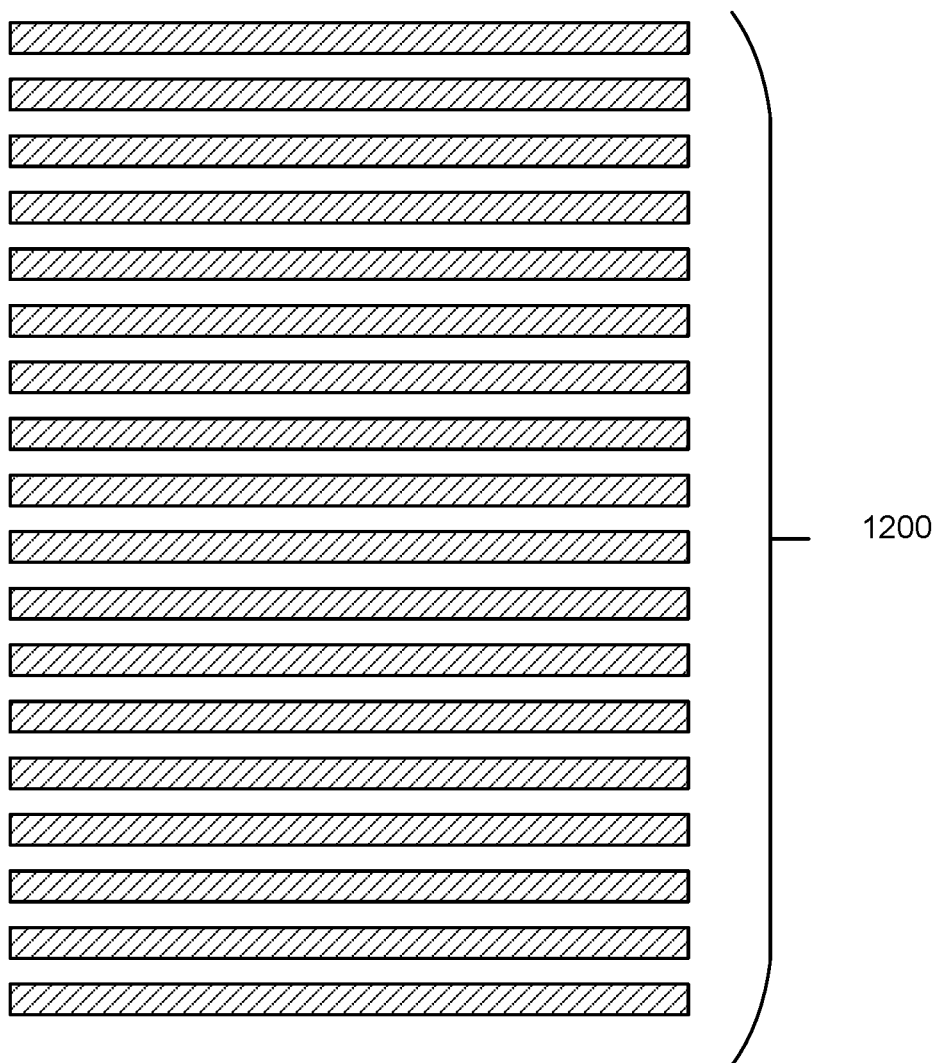
FIG. 14 is a top view of a metal line layer.

FIG. 14 is a top view of metal line layer D2 (1200) in regions B. As discussed above, in regions B metal line layer D2 is used entirely for implementing pass through signal lines. Thus, FIG. 14 shows metal line layer D2 including a plurality of pass through signal lines 1200. In one embodiment, each of the pass through signal lines 1200 implemented in metal line layer D2 has a width of 140 nanometers. In one embodiment, the pitch is 250 nanometers such that the gap between pass through signal lines is 110 nanometers.

Figure 15:
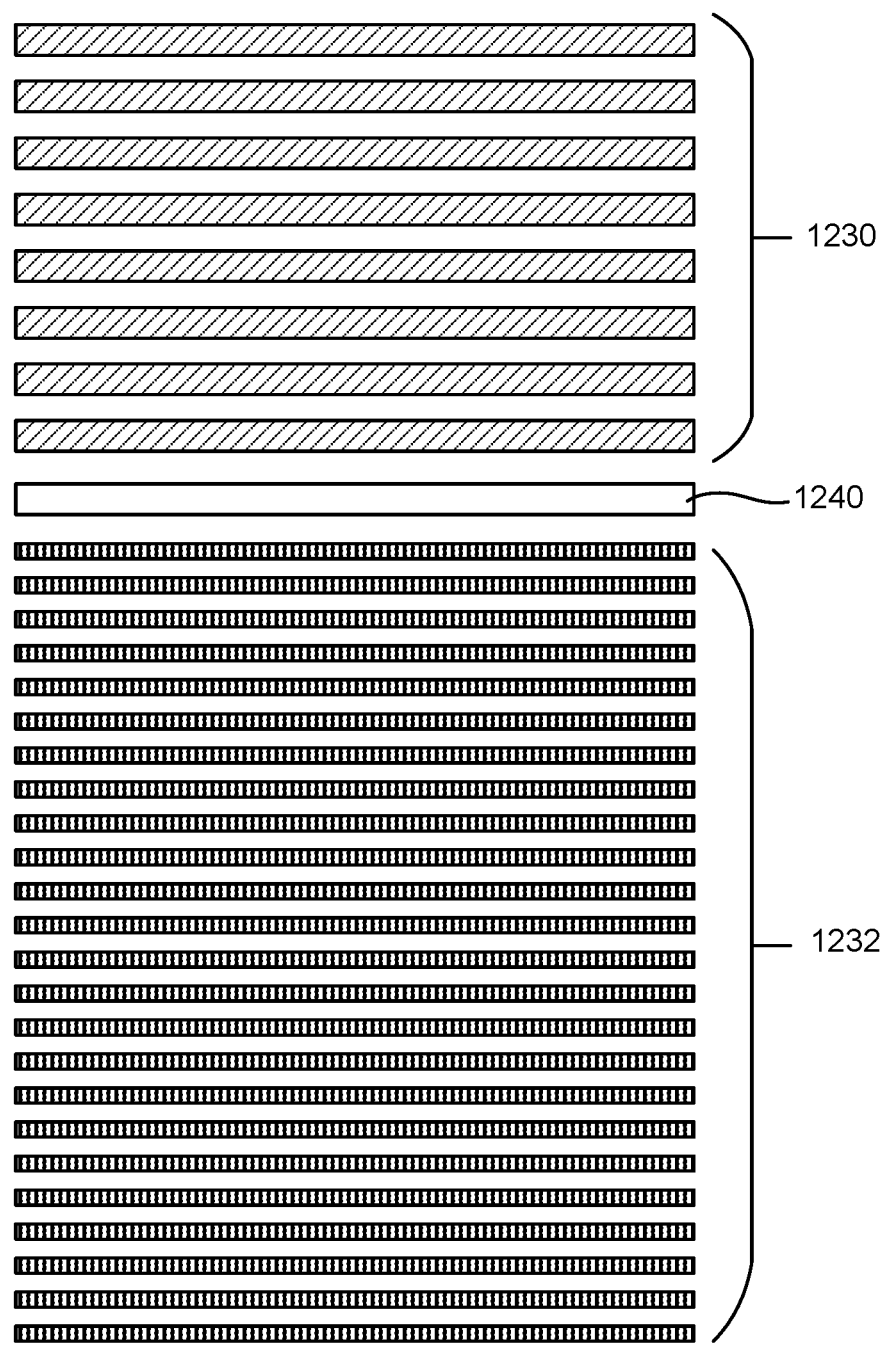
FIG. 15 is a top view of a metal line layer.

FIG. 15 is a top view of metal line layer D2 for region A, in which metal line layer D2 is used to implement both pass through signal lines and word line hook up signal lines. In one embodiment, pass through signal lines 1230 have a first width of 140 nanometers with 110 nanometers gaps between pass through signal lines and word line hook up signal lines 1232 have a width of 50 nanometers with a gap of 50 nanometers between word line hook up signal lines. Thus, the width of the pass through signal lines is greater than the width of the word line hook up signal lines. Additionally, the spacing between pass through signal lines is larger than the spacing between word line hook up signal lines. The ratio of signal line width to spacing for the pass through signal lines is 140/110 while ratio of signal line width to spacing for word line hook up signal lines is 50/50; therefore, the ratio for pass through signal lines is greater than the ratio for word line hook up signal lines. FIG. 15 shows that between pass through signal lines 1230 and word line hook up signal lines 1232 is a shield line 1240. In one embodiment, shield line 1240 is tungsten or copper. In one embodiment, the metal signal lines of pass through signal lines 1230 and word line hook up signal lines 1232 are made from tungsten or copper. While FIG. 15 shows the word line hook up signal lines 1232 on one side of shield line 1240 and pass through signal lines 1230 on another side of shield line 1240, in other embodiments other arrangement for sharing D2 can also be implemented.

FIGS. 14 and 15 explain that in regions B, metal line layer D2 is used to implement only pas through signal lines while in regions A metal signal line layer D2 is used to implement both passive signal lines and word line hook up lines. FIG. 15 shows that regions A the metal signal line layer D2 includes eight pass through signal lines 1230 and 24 word line hook up signal lines 1232. Thus, 32 signal lines are to be depicted to be on a single metal line layer. In other embodiments more or less than 32 lines, more or less than eight pass through signal lines and/or more or less than 24 word line hook up signal lines can be implemented on a single metal line layer. In the embodiment of FIGS. 12-15, the ratio of pass through signal lines to word line hook up signal lines changes for a metal signal line layer D2; however, the ratio for those two signal lines can be changed for other metal line layers in addition to or instead of metal line layer D2.

Figure 16:
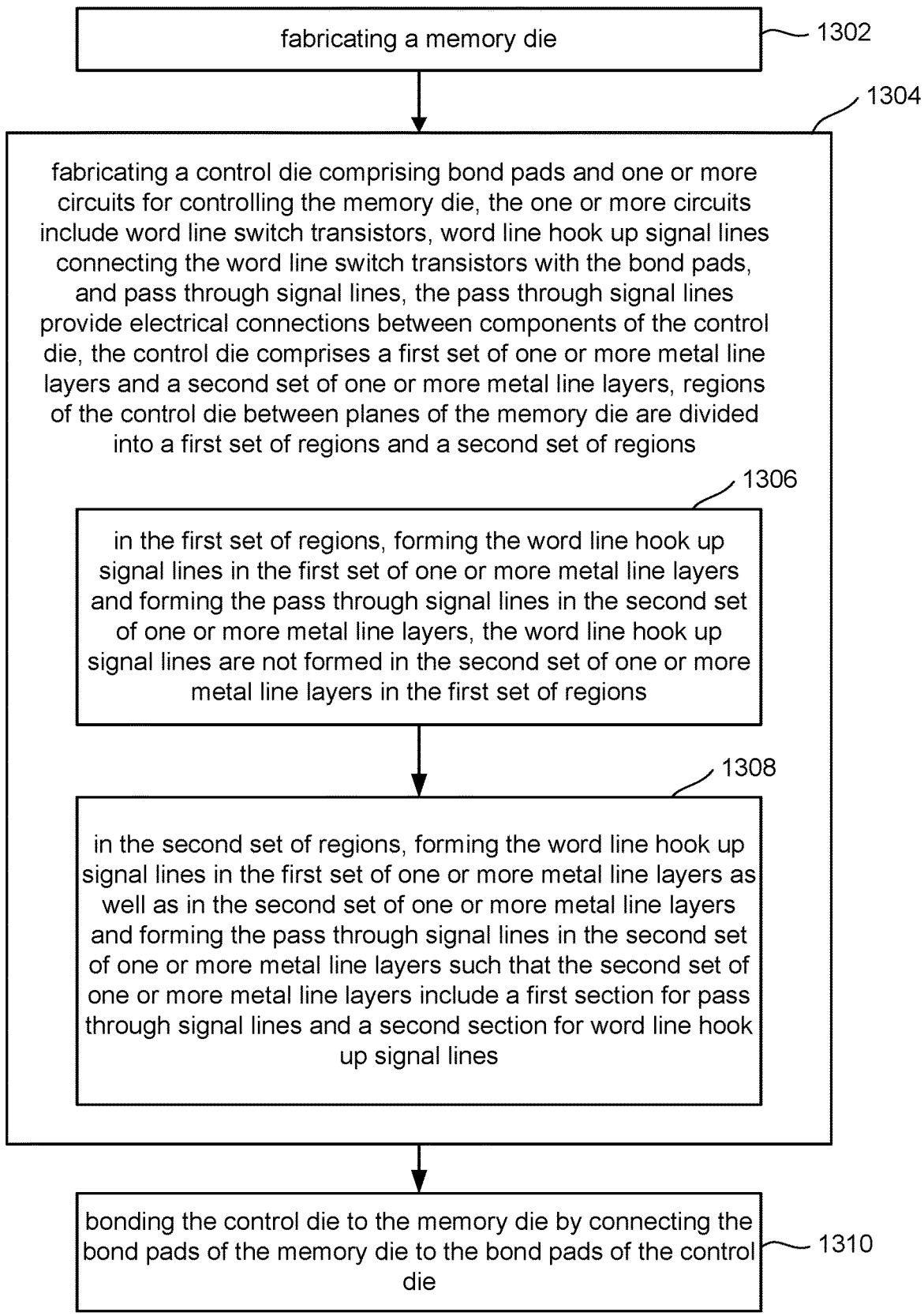
FIG. 16 is a flow chart describing one embodiment of a process for fabricating an integrated memory assembly.

FIG. 16 is a flow chart describing one embodiment of a process for fabricating an integrated memory assembly that implements the structure of FIGS. 12-15. Step 1302 comprises fabricating memory die 201 comprising multiple planes (e.g., Plane 0, Plane 1, Plane 2, Plane 3, Plane 4, Plane 5, Planer 6 and Plane 7). Each plane includes a three dimensional non-volatile memory array. The memory die includes bond pads. Step 1304 includes fabricating a control die 211 comprising bond pads and one or more circuits for controlling the memory die (e.g., one or more control circuits). The one or more circuits include word line switch transistors, word line hook up signal lines connecting the word line switch transistors with the bond pads, and pass through signal lines. As described above, the pass through signal lines provide electrical connections between components of the control die. Control die 211 comprises a first set of one or more metal line layers and a second set of one or more metal line layers. Regions of the control die between planes of the memory die are divided into a first set of regions and a second set of regions. Step 1310 includes bonding control die 211 to memory die 201 by connecting the bond pads of memory die 201 to the bond pads of control die 211.

In one embodiment. the fabricating the control die 211 (step 1304) comprises: in the first set of regions (e.g., B), forming the word line hook up signal lines in the first set of one or more metal line layers (e.g., D0/D1/DX) and forming the pass through signal lines in the second set of one or more metal line layers (e.g., D2) (step 1306). The word line hook up signal lines are not formed in the second set of one or more metal line layers in the first set of regions. In the second set of regions (e.g., A), forming the word line hook up signal lines in the first set of one or more metal line layers (e.g., D0/D1/DX) as well as in the second set of one or more metal line layers (e.g., D2) and forming the pass through signal lines in the second set of one or more metal line layers (e.g., D2) such that the second set of one or more metal line layers include a first section 1230 for pass through signal lines and a second section 1232 for word line hook up signal lines (step 1308). Note that steps 1306 and 1308 can be performed in any order, separately or together.

FIGS. 17-21 describe the second embodiment in which the integrated memory assembly is divided into sets of regions between planes of the memory based on proximity to various circuit elements. For example, in a first set of regions that are adjacent (or between) sense amplifier regions, a first scheme is used for allocating horizontal metal lines to pass through signal lines, horizontal metal lines to connect word line switch transistors to the corresponding word lines (via bond pads) and horizontal metal lines to connect sense amplifiers to corresponding bit lines. In a second set of regions that are not adjacent (or between) sense amplifier regions, a second scheme is used for allocating horizontal metal lines to pass through signals, horizontal metal lines to connect word line switch transistors to corresponding word lines (via bond pads), and horizontal metal lines to connect sense amplifiers to corresponding bit lines. The embodiment of FIGS. 17-21 can be used together with the embodiment of FIGS. 12-16, or the embodiment of FIGS. 17-21 can be used separately from the embodiment of FIGS. 12-16. For example, in one embodiment a memory can be designed and fabricated using the architecture of the embodiment of FIGS. 12-16 only or, a memory can be designed and manufactured using the structure of FIG. 17-21 only. In another alternative, the memory can be designed and fabricated to implement the technology of FIGS. 12-16 and of FIGS. 17-21. For example, when combining the two embodiments, there could be four regions which two of the regions use the structure of the embodiment of FIGS. 12-16 and two of the region used to structure of the embodiment of FIGS. 17-21. Alternatively, the regions can be combined.

Figure 17:
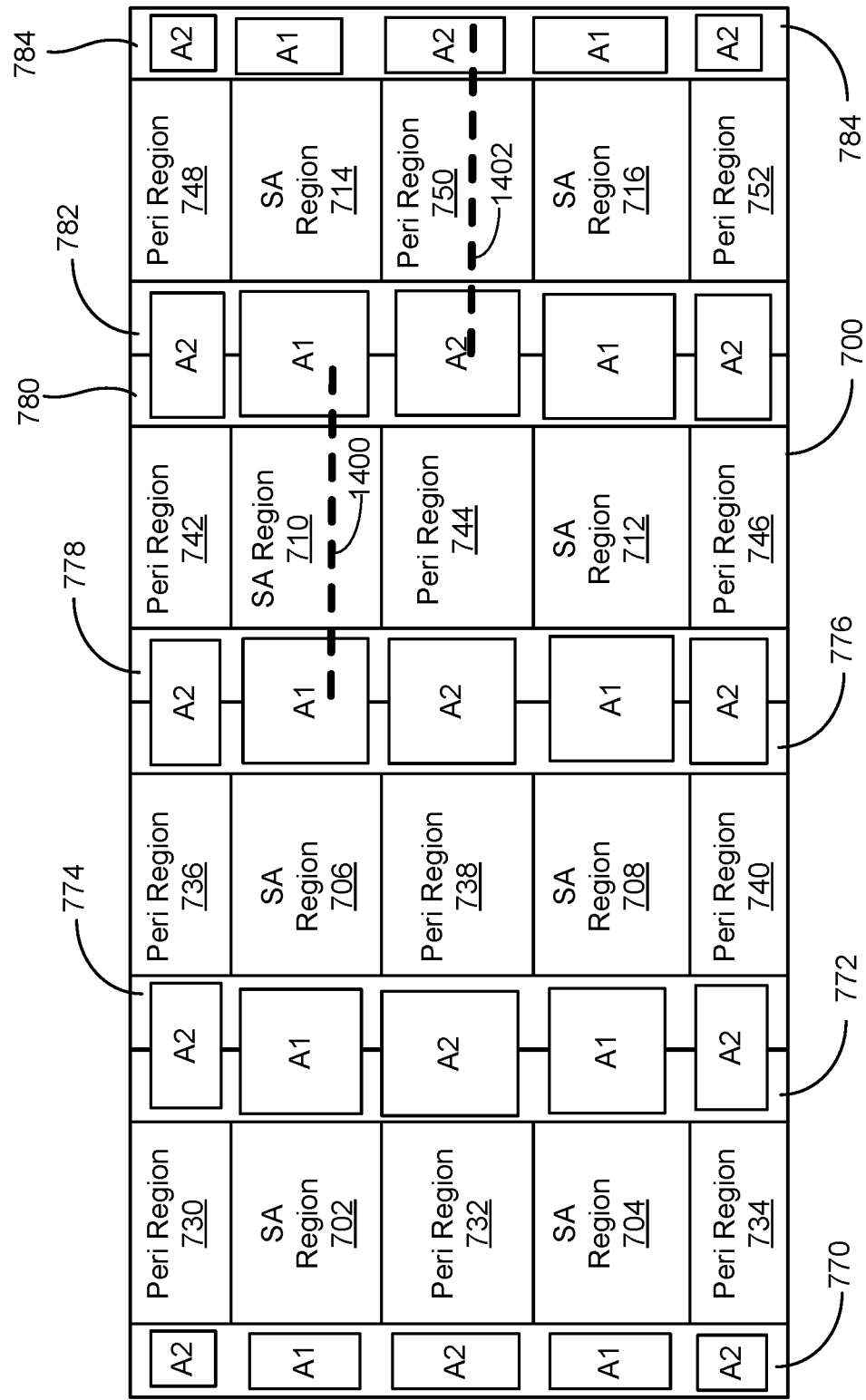
FIG. 17 depicts a top view of a control die.

FIG. 17 shows a top view of another embodiment of control die 211, depicting the top surface of substrate 700. Control die 211 includes sense amplifier region 702, 704, 706, 708, 710, 712, 714 and 716, Peri regions 730, 732, 734, 736, 738, 740, 742, 744, 746, 748, 750 and 752; and word line switch regions 770, 772, 774, 776, 778, 780, 782 and 784. The word line switch regions correspond to areas below the word line hook up regions in the memory arrays and/or below end portions of the memory arrays (or below and between the planes). In the embodiment of FIGS. 17-21, word line switch regions 770, 772, 774, 776, 778, 780, 782 and 784 are divided into two sets of regions: regions A1 and regions A2. In other embodiments more than two sets of regions can be used. FIG. 17 depicts multiple regions A1 and muktiple regions A2. Regions A1 are between (or adjacent) sense amplifier regions 702-716. Regions A2 are between (or adjacent) Peri regions 730-752. In regions A1, the system uses all of metal line layer M2 in the CBL area of the memory die for bit line hook up signal lines, the bond pads in the CBL area are not used (either do not exist or are dummy bond pads), pass through signal lines are only implemented in metal line layer D2 of the control die in the regions over the word line switch areas, bond pads over the word line switch regions are for word line hook up signal lines, and metal line layers D0/D1/DX are used for word line hook up signal lines. In regions A2, there is less pass through signal lines than regions A1 and there is less need for bit line hook up signal lines because the sense amplifiers are not close by so there are no bit line hook ups and the extra space can be used for word line hook ups. Thus, in regions A2 pass through signal lines are implemented in metal line layers D1 and D2, and as a result there is potentially less space available for word line hook up signal lines. Because there is less space for word line hook ups in regions A2, some of the word line hook up signal lines are routed to bond pads in the CBL area. More details about regions A1 are discussed below with respect to FIG. 19. More detail about regions A2 are discussed below with respect to FIG. 20.

FIG. 18 is a table that provides details for one embodiment of a metal budget for word line hook up signal lines. That is FIG. 18 indicates how many horizontal metal signal lines can be implemented for word line hook ups over the word line switch regions for each of the metal line layers D0/D1/DX and M2. For example, in regions A1 metal line layer M2 will have zero word line hook up signal lines, metal line layer DX will include 60 word line hook signal lines, metal line layer D1 will include 60 word line hook up signal lines, and metal line layer D0 will include 46 word line hook up signal lines. In regions A2, metal line layer M2 will include 60 word line hook up signal lines, metal line layer DX will include 60 word line hook signal lines, metal line layer D1 will include zero word line hook up signal lines, and metal line layer D0 will include 46 word line hook up signal lines. In other embodiments, different budgets for the numbers of word line hook up signal lines can also be used. The table in FIG. 18 is just one example.

FIG. 19 shows a cross section of a portion of an embodiment of integrated memory assembly 207. The cross section of FIG. 19 is taken along dashed line 1400 of FIG. 17, through sense amplifier region 710 and two regions A1. FIG. 19 shows the integrated memory assembly including memory die 201 bonded to control die 211. The portion of control die 211 depicted in the cross section of FIG. 19 includes (in substrate 700) word line switch region 778, sense amplifier region 710 and word line switch region 780. Above substrate 700 are metal line layers D0, D1, DX and D2.

In the embodiment of FIG. 19, memory die 201 includes a memory array 1500. Depicted in FIG. 19 are four word lines 1510, 1512, 1514 and 1516 of memory array 1500. Four word lines are depicted to make the drawing easy to read, but in most embodiments more than four word lines would be used. It is also possible to use less than four word lines. Below the word lines are a set of bit lines 1520. The word lines depicted in FIG. 19 appear to be horizontal because they are going from left to right on the page while bit lines go in and out of the page. Below bit lines 1520 are a set of bond pads 1530 for memory die 201. Between bond pads 1530 and the word lines (1510, 1512, 1514 and 1516) are two metal line layers: M1 and M2 (discussed above). In one embodiment, bit lines 1520 are implemented in metal line layer M1. Horizontal lines below the bit lines and above the bond pads are implemented in metal line layer M2. Control die 211 includes bond pads 1532, which (in one embodiment) are bonded (connected) to bond pads 1530 of memory die 201.

As can be seen from FIG. 19, the word lines 1510, 1512, 1514 and 1516 are arranged in an inverted staircase structure such that word line length increases from bottom to top of the three dimensional non-volatile memory structure. For example, the two ends of the stack of word lines (1510, 1512, 1514 and 1516) are in the shape of an inverted staircase. This portion of where the staircases are positioned are referred to as staircase areas, which in FIG. 19 includes staircase area 1540 and staircase area 1542. FIG. 19 shows how the staircase areas line up over the word line switch regions 778/780. Staircase areas 1540 and 1542 can also be referred to as word line hook up regions because control die 211 will send signals that connect to the word lines in these word line hook up regions/staircase areas 1540/1542. As can be seen, the staircase areas 1540/1542 are at end portions of the memory array. Thus, the word line switch regions 778/780 are positioned below the staircase areas, below the word line hook up regions, below end portions of the memory arrays, as well as below and between the planes. CBL areas 1544/1546 are similar to CBL areas 830/832.

The bond pads 1530 below the staircase areas 1540/1542 are used for vertical connections to word lines. The bond pads 1532 of control die 211 in the staircase area 1540 are connected to word line switch transistors in word line switch region 778 and 780. Because some of the word line switch transistors are in the CBL areas 1544/1546, horizontal signal lines are needed and are depicted in D0, D1 and DX. In regions A1 (depicted in FIG. 19) metal line layer D2 is used only for pass through signal lines. For example, FIG. 19 shows pass through signal lines 1550 and 1552, which are not shown connected to actual components on the control die for purposes of making the drawing easy to read, but both 1550 and 1552 would be connected to components on control die 211.

FIG. 19 shows a structure where all of metal line layer M2 in the CBL areas 1544 and 1546 is used for bit line hook ups (e.g., connecting bond pads to bit lines). In other embodiments, it is possible to use some portions of metal line layer M2 for word line hook ups. Additionally, all bond pads in the CBL area 1544 and 1546 are either missing or are dummy bond pads (not used). Pass through signals are only implemented in metal line layer D2 over word line switch regions 778 and 780. All bond pads over word line switch regions are used for word line hook up signal lines only. Metal line layers D0/D1 and DX are used for word line hook up signal lines (connecting word line switch transistors to bond pads).

Note that the word line hook up lines in memory die 201 within staircase area 1542 are not shown connected to the word lines because not all word lines are depicted. But in an actual embodiment those word line hook up lines would be connected to actual word lines.

Figure 20:
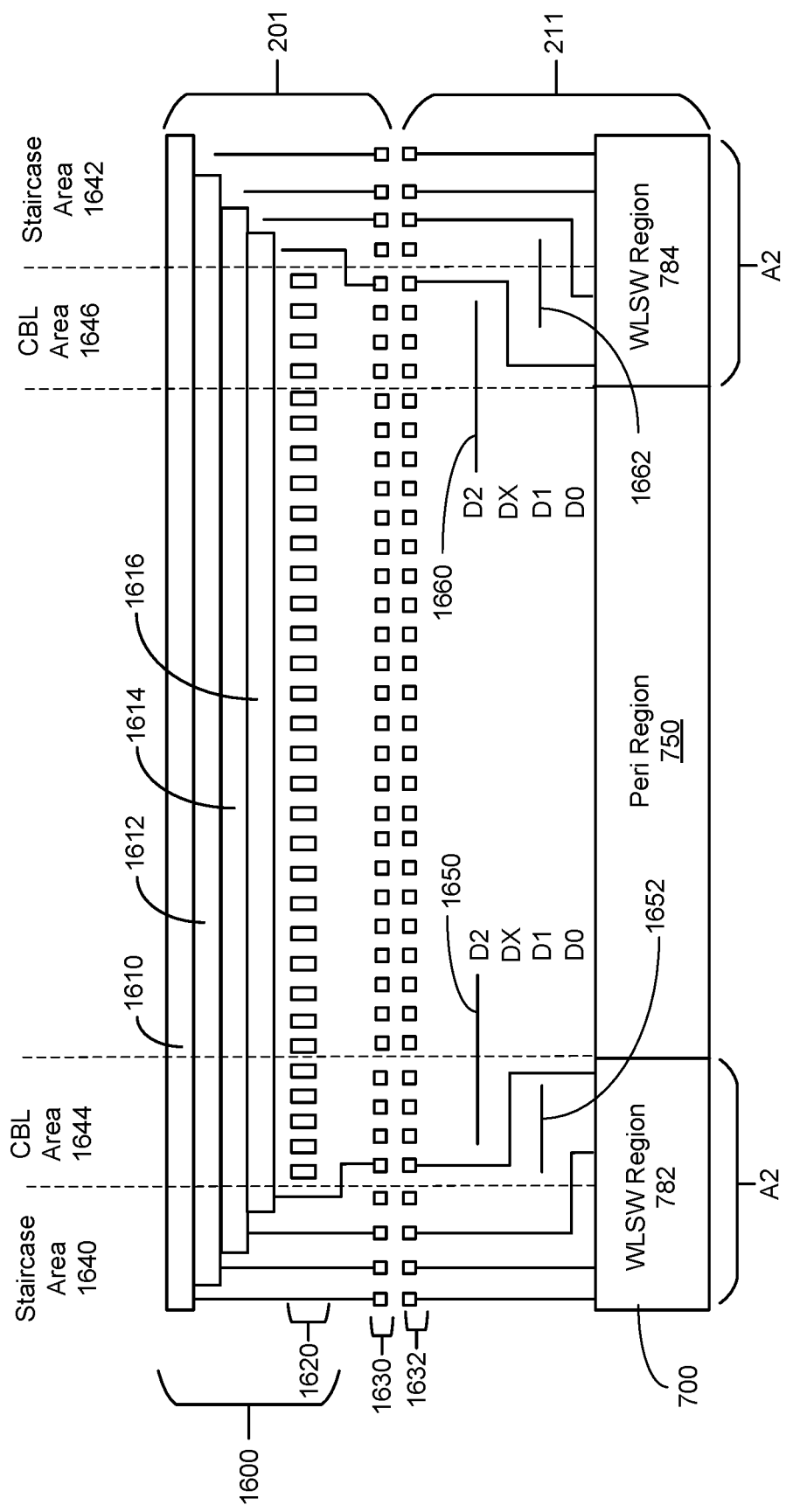
FIG. 20 shows a cross section of a portion of an integrated memory assembly.

FIG. 20 shows a cross section of a portion of integrated memory assembly 2007 along dashed line 1402 of FIG. 17. FIG. 20 shows more details of regions A2. The portion of substrate 700 of control die 211 depicted in FIG. 20 includes word line switch region 782, word line switch region 784 and peripheral circuits region 750. Above substrate 700 includes metal line layers D0, D1, DX and D2, as well as vertical metal line layer D3 (not depicted in FIG. 20). Above the metal line layers are bond pads 1632 of control die 211.

Memory die 201 includes memory array 1600. FIG. 20 depicts word lines 1610, 1612, 1614 and 1616 of memory array 1600. Only four word lines are depicted to make the drawing easy to read; however, in most embodiments more than four word lines will be used. To make the drawing simpler and easier to read, FIG. 20 does not depict the memory holes or the dielectric regions between the word line layers. Below the word line layers are bit lines 1620 (which extend in and out of the page). In one embodiment, memory die 201 will include two metal layers: M1 and M2. In one embodiment, bit lines 1620 are implemented in metal line layer M1. Below the metal line layers are bond pads 1630 of memory die 201. Bond pads 1630 are bonded to bond pads 1632.

As can be seen from FIG. 20, the word lines 1610, 1612, 1614 and 1616 are arranged in an inverted staircase structure such that word line length increases from bottom to top of the three dimensional non-volatile memory structure. For example, the two ends of the stack of word lines (1610, 1612, 1614 and 1616) are in the shape of an inverted staircase. This portion of where the staircases are positioned are referred to as staircase areas, which in FIG. 20 includes staircase area 1640 and staircase area 1642. FIG. 20 shows how the staircase areas line up over the word line switch regions 782/784. Staircase areas 1640 and 1642 can also be referred to as word line hook up regions because control die 211 will send signals that connect to the word lines in these word line hook up regions/staircase areas 1640/1642. As can be seen, the staircase areas 1640/1642 are at end portions of the memory array. Thus, the word line switch regions 782/784 are positioned below the staircase areas, below the word line hook up regions, below end portions of the memory arrays, as well as below and between the planes. CBL areas 1644/1646 are similar to CBL areas 830/832.

The word line switch regions (e.g., 782 and 784) are below the word line hook up regions, below end portions of the memory arrays, and below and between planes, as described above. FIG. 20 shows that the word line switch regions and areas above those regions are divided into staircase areas 1640/1642 and CBL areas 1644/1646. FIG. 20 shows that in areas A2 the word line hook ups (signals from WLSW region 782/784 to bond pad 1632) include horizontal lines in metal line layers D0 and DX, but not in D1 and D2. Pass through signals 1650 and 1660 are implemented in metal line layer D2, and pass through signal 1652 and 1662 are implemented in metal line layer D1. In the cross section of FIG. 20, there are no connections between bond pads 1630 and bit lines 1620. Additionally, in the CBL area of 1644 and 15646 there are word line hook up connections between bond pad 1630 and corresponding word lines.

The structure of FIG. 20 demonstrates how regions A2 include no bit line hook ups in metal line layer M1 of memory die 201; therefore extra space that would have been used for bit line hook ups are now used for word line hook ups. As a result, signal line layer M2 in the memory die 201 can be used for word line hook ups between bond pads 1630 in CBL areas 1644/1646 and the appropriate word lines. Note that the word line hook up lines in memory die 201 within staircase area 1642 are not shown connected to the word lines because not all word lines are depicted. But in an actual embodiment those word line hook up lines would be connected to actual word lines. FIG. 20 also shows that in regions A2, pass through signals get to use D1 and D2, which means there is less space on the control die for word line hook ups. Because there is less space for word line hook ups, some of the word line hook up connections are routed to bond pads in the CBL area.

FIGS. 19 and 20 describe an embodiment in which regions of the one or more control circuits are divided into a first set of regions (e.g., A1) and a second set of regions (e.g., A2). The first set of regions include only word line hook up signal lines in the first set of one or more metal line layers (not pass through signals), pass through signal lines in the second set of one or more metal line layers (not word line hook up signals), and word line hook up signal lines in the third set of one or more metal line layers (mot pass through signals). The second set of regions include word line hook up signal lines in the first set of one or more metal line layers (not pass through signals), pass through signal lines in the second set of one or more metal line layers (not word line hookup signals), and pass through signal lines in the third set of one or more metal line layers (not word line hook up signals). Additionally, above the first set of regions, the second metal line layer includes connections from the first set of bond pads to the bit lines formed in the first metal line layer and the second metal line layer does not include connections from the first set of bond pads to the word lines. Above the second set of regions, the second metal line layer includes connections from the first set of bond pads to the word lines and the second metal line layer does not include connections from the first set of bond pads to the bit lines formed in the first metal line layer. Bond pads of the memory die that are positioned above first portions of word line switch regions are connected to the word lines; above the second set of regions, bond pads of the memory die positioned above second portions of word line switch regions are connected to the word lines; and above the first set of regions, there are no connections between word lines and bond pads of the first set of bond pads.

FIG. 21 is a flow chart describing one embodiment of a process for fabricating an integrated memory assembly that implements the structure of FIGS. 19 and 20. Step 1702 includes fabricating a memory die 201 comprising multiple planes (e.g., Plane 0, Plane 1, Plane 2, Plane 3, Plane 4, Plane 5, Planer 6 and Plane 7). Each plane includes a three dimensional non-volatile memory array. The memory die includes a first set of bond pads. Each of the three dimensional non-volatile memory arrays includes bit lines and word lines connected to non-volatile memory cells. The memory die includes a first metal line layer (e.g., M1) and a second metal line layer (e.g., M2). The first metal line layer is positioned between the second metal line layer and the multiple planes. The second metal line layer is positioned between the first metal line layer and the first set of bond pads. The bit lines are formed in the first metal line layer.

In one embodiment, the fabricating the memory die (step 1702) comprises: above the first set of regions (e.g., A1), forming connections in the second metal line layer from the first set of bond pads to the bit lines and without forming connections in the second metal line layer from the first set of bond pads to the word lines in step 1704; and above the second set of regions (e.g., A2), forming connections in the second metal line layer from the first set of bond pads to the word lines without forming connections in the second metal line layer from the first set of bond pads to the bit lines in step 1706. Note that steps 1704 and 1706 can be performed in any order, separately or together.

Step 1708 includes fabricating a control die 211 comprising a second set of bond pads and one or more circuits for controlling the memory die 201. The one or more control circuits include word line switch transistors and word line hook up signal lines connecting the word line switch transistors with the second set of bond pads. The one or more control circuits further include pass through signal lines that provide electrical connections between components of the control die. Regions of the control die below end portions of the planes of the memory die are divided into a first set of regions (e.g., A1) and a second set of regions (e.g., A2).

In one embodiment, the fabricating the control die (step 1708) comprises: in the first set of regions, forming word line hook up signal lines in the first set of one or more metal line layers (e.g., D0 and DX), pass through signal lines in the second set of one or more metal line layers (e.g., D2), and word line hook up signal lines in the third set of one or more metal line layers (e.g., D1) in step 1710; and in the second set of regions, forming word line hook up signal lines in the first set of one or more metal line layers, pass through signal lines in the second set of one or more metal line layers, and pass through signal lines in the third set of one or more metal line layers in step 1712. Note that steps 1710 and 1712 can be performed in any order, separately or together.

Step 1714 includes bonding the control die 211 to the memory die 201 by connecting/bonding the first set of bond pads to the second set of bond pads.

Multiple architectures for the word line hook up regions have been described for overcoming a shortage of area for metal lines needed for horizontal metal lines to connect word line switch transistors to corresponding word lines and for pass through signal lines.

One embodiment includes a non-volatile storage apparatus comprising a three dimensional non-volatile memory structure that includes word lines connected to non-volatile memory cells; one or more control circuits below the three dimensional non-volatile memory structure and configured to control the three dimensional non-volatile memory structure; a first set of one or more metal line layers above the one or more circuits and below the three dimensional non-volatile memory structure; and a second set of one or more metal line layers (e.g., D2) above the one or more circuits and below the three dimensional non-volatile memory structure. The one or more control circuits include word line switch transistors. The one or more control circuits further include word line hook up signal lines connecting the word line switch transistors to word lines and pass through signal lines that provide electrical connections between components of the one or more control circuits, regions of the one or more control circuits are divided into a first set of regions and a second set of regions. The first set of regions (e.g., B) include word line hook up signal lines in the first set of one or more metal line layers and pass through signal lines in the second set of one or more metal line layers. The word line hook up signal lines are not included in the second set of one or more metal line layers in the first set of regions. The second set of regions (e.g., A) include word line hook up signal lines in the first set of one or more metal line layers and in the second set of one or more metal line layers. The second set of regions further include pass through signal lines in the second set of one or more metal line layers.

One example implementation further includes a semiconductor die. The one or more control circuits are positioned on the semiconductor die. The semiconductor die comprises word line switch transistor regions and sense amplifier regions. The word line switch regions include first portions below word line hook up regions of the three dimensional non-volatile memory structure and second portions that are not below word line hook up regions of the three dimensional non-volatile memory structure. The first set of regions are word line switch transistor regions having word line switch transistors in the first portions and not in the second portions. The second set of regions are word line switch transistor regions having word line switch transistors in the first portions and in the second portions. The second set of regions include horizontal word line hook up signal lines above the second portions that connect to word line switch transistors of the second portions. The first set of regions do not include horizontal word line hook up signal lines above the second portions. The word line switch regions include first portions below word line hook up regions of the three dimensional non-volatile memory structure (e.g., staircase area) and second portions that are not below word line hook up regions of the three dimensional non-volatile memory structure (e.g., CBL area).

One embodiment includes a non-volatile storage apparatus comprising a memory die that has multiple planes and a control die comprising a second set of bond pads and one or more control circuits configured to control the memory die. Each plane includes a three dimensional non-volatile memory array. The memory die includes a first set of bond pads. Each of the three dimensional non-volatile memory arrays includes bit lines and word lines connected to non-volatile memory cells. The one or more control circuits include word line switch transistors, word line hook up signal lines connecting the word line switch transistors with the second set of bond pads, and pass through signal lines that provide electrical connections between components of the control die. The control die comprises a first set of one or more metal line layers and a second set of one or more metal line layers. Regions of the control die below end portions of the planes of the memory die are divided into a first set of regions and a second set of regions. The first set of regions include word line hook up signal lines in the first set of one or more metal line layers and pass through signal lines in the second set of one or more metal line layers. The word line hook up signal lines are not included in the second set of one or more metal line layers in the first set of regions. The second set of regions include word line hook up signal lines in the first set of one or more metal line layers and in the second set of one or more metal line layers. The second set of regions further include pass through signal lines in the second set of one or more metal line layers such that the second set of one or more metal line layers include a first section for pass through signal lines and a second section for word line hook up signal lines. In one example implementation, the second set of regions (e.g., B) are positioned at edges of the control die and the first set of regions (e.g., A) are positioned in a middle area of the control die.

One embodiment includes a method comprising: fabricating a memory die comprising multiple planes, each plane including a three dimensional non-volatile memory array, the memory die includes bond pads; fabricating a control die comprising bond pads and one or more circuits for controlling the memory die, the one or more circuits include word line switch transistors, word line hook up signal lines connecting the word line switch transistors with the bond pads, and pass through signal lines, the pass through signal lines provide electrical connections between components of the control die, the control die comprises a first set of one or more metal line layers and a second set of one or more metal line layers, regions of the control die between planes of the memory die are divided into a first set of regions and a second set of regions; and bonding the control die to the memory die by connecting the bond pads of the memory die to the bond pads of the control die. The fabricating the control die comprises: in the first set of regions, forming the word line hook up signal lines in the first set of one or more metal line layers and forming the pass through signal lines in the second set of one or more metal line layers, the word line hook up signal lines are not formed in the second set of one or more metal line layers in the first set of regions; and in the second set of regions, forming the word line hook up signal lines in the first set of one or more metal line layers as well as in the second set of one or more metal line layers and forming the pass through signal lines in the second set of one or more metal line layers such that the second set of one or more metal line layers include a first section for pass through signal lines and a second section for word line hook up signal lines.

One embodiment includes a non-volatile storage apparatus comprising a three dimensional non-volatile memory structure that includes word lines connected to non-volatile memory cells; one or more control circuits below the three dimensional non-volatile memory structure and configured to control the three dimensional non-volatile memory structure; a first set of one or more metal line layers (e.g., D0 and DX) above the one or more circuits and below the three dimensional non-volatile memory structure; a second set of one or more metal line layers (e.g., D2) above the one or more circuits and below the three dimensional non-volatile memory structure; and a third set of one or more metal line layers (e.g., D1) above the one or more circuits and below the three dimensional non-volatile memory structure. The one or more control circuits include word line switch transistors. The one or more control circuits further include word line hook up signal lines connecting the word line switch transistors to word lines and pass through signal lines that provide electrical connections between components of the one or more control circuits. Regions of the one or more control circuits are divided into a first set of regions (e.g., A1) and a second set of regions (e.g., A2). The first set of regions include word line hook up signal lines in the first set of one or more metal line layers, pass through signal lines in the second set of one or more metal line layers, and word line hook up signal lines in the third set of one or more metal line layers. The second set of regions include word line hook up signal lines in the first set of one or more metal line layers, pass through signal lines in the second set of one or more metal line layers, and pass through signal lines in the third set of one or more metal line layers.

One example implementation includes a memory die (the memory die includes the three dimensional non-volatile memory structure and a first set of bond pads connected to the three dimensional non-volatile memory structure) and a control die (the control die includes the one or more control circuits and a second set of bond pads, the first set of bond pads are connected to the second set of bond pads). The memory die includes a first metal line layer and a second metal line layer. The first metal line layer is positioned between the second metal line layer and the three dimensional non-volatile memory structure. The second metal line layer is positioned between the first metal line layer and the first set of bond pads. The three dimensional non-volatile memory structure includes bit lines formed in the first metal line layer. Above the first set of regions, the second metal line layer includes connections from the first set of bond pads to the bit lines formed in the first metal line layer and the second metal line layer does not include connections from the first set of bond pads to the word lines. Above the second set of regions, the second metal line layer includes connections from the first set of bond pads to the word lines and the second metal line layer does not include connections from the first set of bond pads to the bit lines formed in the first metal line layer.

In one example implementation, the control die comprises word line switch transistor regions; the word line switch regions include first portions below word line hook up regions of the three dimensional non-volatile memory structure and second portions that are not below word line hook up regions of the three dimensional non-volatile memory structure; bond pads of the first set of bond pads positioned above first portions of word line switch regions are connected to the word lines; above the second set of regions, bond pads of the first set of bond pads positioned above second portions of word line switch regions are connected to the word lines; above the first set of regions, there are no connections between word lines and bond pads of the first set of bond pads.

One embodiment includes a non-volatile storage apparatus comprising: a memory die comprising multiple planes, each plane includes a three dimensional non-volatile memory array, the memory die includes a first set of bond pads, each of the three dimensional non-volatile memory arrays includes bit lines and word lines connected to non-volatile memory cells; and a control die comprising a second set of bond pads and one or more control circuits configured to control the memory die, the second set of bond pads are bonded to the first set of bond pads. The one or more control circuits include word line switch transistors, word line hook up signal lines connecting the word line switch transistors with the second set of bond pads, and pass through signal lines that provide electrical connections between components of the control die. Regions of the control die below end portions of the planes of the memory die are divided into a first set of regions and a second set of regions. The memory die includes a first metal line layer and a second metal line layer. The first metal line layer is positioned between the second metal line layer and the multiple planes. The second metal line layer is positioned between the first metal line layer and the first set of bond pads. The multiple planes include bit lines formed in the first metal line layer. Above the first set of regions, the second metal line layer includes connections from the first set of bond pads to the bit lines formed in the first metal line layer and the second metal line layer does not include connections from the first set of bond pads to the word lines. Above the second set of regions, the second metal line layer includes connections from the first set of bond pads to the word lines and the second metal line layer does not include connections from the first set of bond pads to the bit lines formed in the first metal line layer.

One embodiment includes a method comprising: fabricating a memory die comprising multiple planes, each plane includes a three dimensional non-volatile memory array, the memory die includes a first set of bond pads, each of the three dimensional non-volatile memory arrays includes bit lines and word lines connected to non-volatile memory cells, the memory die includes a first metal line layer and a second metal line layer, the first metal line layer is positioned between the second metal line layer and the multiple planes, the second metal line layer is positioned between the first metal line layer and the first set of bond pads, the bit lines are formed in the first metal line layer; fabricating a control die comprising a second set of bond pads and one or more circuits for controlling the memory die, the one or more control circuits include word line switch transistors and word line hook up signal lines connecting the word line switch transistors with the second set of bond pads, the one or more control circuits further include pass through signal lines that provide electrical connections between components of the control die, regions of the control die below end portions of the planes of the memory die are divided into a first set of regions and a second set of regions; and bonding the control die to the memory die by connecting the first set of bond pads to the second set of bond pads. The fabricating the memory die comprises: above the first set of regions, forming connections in the second metal line layer from the first set of bond pads to the bit lines and without forming connections in the second metal line layer from the first set of bond pads to the word lines; and above the second set of regions, forming connections in the second metal line layer from the first set of bond pads to the word lines without forming connections in the second metal line layer from the first set of bond pads to the bit lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a three dimensional non-volatile memory structure that includes word lines connected to non-volatile memory cells;
   one or more control circuits below the three dimensional non-volatile memory structure and configured to control the three dimensional non-volatile memory structure, the one or more control circuits include word line switch transistors, the one or more control circuits further include word line hook up signal lines connecting the word line switch transistors to word lines and pass through signal lines that provide electrical connections between components of the one or more control circuits, regions of the one or more control circuits are divided into a first set of regions and a second set of regions;
   a first set of one or more metal line layers above the one or more circuits and below the three dimensional non-volatile memory structure;
   a second set of one or more metal line layers above the one or more circuits and below the three dimensional non-volatile memory structure; and
   a third set of one or more metal line layers above the one or more circuits and below the three dimensional non-volatile memory structure,
   the first set of regions include word line hook up signal lines in the first set of one or more metal line layers, pass through signal lines in the second set of one or more metal line layers, and word line hook up signal lines in the third set of one or more metal line layers;
   the second set of regions include word line hook up signal lines in the first set of one or more metal line layers, pass through signal lines in the second set of one or more metal line layers, and pass through signal lines in the third set of one or more metal line layers.

2. The non-volatile storage apparatus of claim 1, further comprising:
   a memory die, the three dimensional non-volatile memory structure is part of the memory die;
   a control die connected to the memory die, the one or more control circuits are part of the control die, the control die includes word line switch transistor regions and sense amplifier regions and peripheral circuit regions;
   the first set of regions include word line switch transistor regions and are positioned adjacent to sense amplifier regions; and
   the second set of regions are include word line switch transistor regions and are positioned adjacent to peripheral circuit regions.

3. The non-volatile storage apparatus of claim 1, further comprising:
   a memory die, the memory die includes the three dimensional non-volatile memory structure and a first set of bond pads connected to the three dimensional non-volatile memory structure; and
   a control die, the control die includes the one or more control circuits and a second set of bond pads, the first set of bond pads are connected to the second set of bond pads.

4. The non-volatile storage apparatus of claim 3, wherein:
   the memory die includes a first metal line layer and a second metal line layer, the first metal line layer is positioned between the second metal line layer and the three dimensional non-volatile memory structure, the second metal line layer is positioned between the first metal line layer and the first set of bond pads, the three dimensional non-volatile memory structure includes bit lines formed in the first metal line layer;

above the first set of regions, the second metal line layer includes connections from the first set of bond pads to the bit lines formed in the first metal line layer and the second metal line layer does not include connections from the first set of bond pads to the word lines; and above the second set of regions, the second metal line layer includes connections from the first set of bond pads to the word lines and the second metal line layer does not include connections from the first set of bond pads to the bit lines formed in the first metal line layer.

5. The non-volatile storage apparatus of claim 4, wherein:
the word lines are arranged in an inverted staircase structure such that word line length increases from bottom to top of the three dimensional non-volatile memory structure; and
in the second set of regions, the second metal line layer includes connections from the first set of bond pads to the word lines of the inverted staircase structure.

6. The non-volatile storage apparatus of claim 3, wherein:
the control die comprises word line switch transistor regions;
the word line switch regions include first portions below word line hook up regions of the three dimensional non-volatile memory structure and second portions that are not below word line hook up regions of the three dimensional non-volatile memory structure;
bond pads of the first set of bond pads positioned above first portions of word line switch regions are connected to the word lines;
above the second set of regions, bond pads of the first set of bond pads positioned above second portions of word line switch regions are connected to the word lines; and
above the first set of regions, there are no connections between word lines and bond pads of the first set of bond pads.

7. The non-volatile storage apparatus of claim 6, wherein:
the word lines are arranged in an inverted staircase structure such that word line length increases from bottom to top of the three dimensional non-volatile memory structure;
the memory die includes a first metal line layer and a second metal line layer, the first metal line layer is positioned between the second metal line layer and the three dimensional non-volatile memory structure, the second metal line layer is positioned between the first metal line layer and the first set of bond pads, the three dimensional non-volatile memory structure includes bit lines formed in the first metal line layer;
above the first set of regions, the second metal line layer includes connections from the first set of bond pads to the bit lines formed in the first metal line layer and the second metal line layer does not include connections from the first set of bond pads to the word lines; and
above the second set of regions, the second metal line layer includes connections from the first set of bond pads to the word lines and the second metal line layer does not include connections from the first set of bond pads to the bit lines formed in the first metal line layer.

8. The non-volatile storage apparatus of claim 1, wherein:
the regions of the one or more control circuits that are divided into a first set of regions and a second set of regions are regions below word line hook up regions of the three dimensional non-volatile memory structure.

9. The non-volatile storage apparatus of claim 1, wherein:
the three dimensional non-volatile memory structure includes a plurality of memory arrays, the regions of the one or more control circuits that are divided into a first set of regions and a second set of regions are regions below end portions of the memory arrays.

10. The non-volatile storage apparatus of claim 1, wherein:
the three dimensional non-volatile memory structure includes a plurality of planes, the regions of the one or more control circuits that are divided into a first set of regions and a second set of regions are regions below and between planes.

11. The non-volatile storage apparatus of claim 1, wherein:
the first set of one or more metal line layers include two horizontal metal layers;
the second set of one or more metal line layers include one horizontal layer above the first set of one or more metal line layers; and
the third set of one or more metal line layers include one horizontal layer between the two horizontal metal layers of the first set of one or more metal line layers.

12. The non-volatile storage apparatus of claim 1, further comprising:
a semiconductor die, the one or more control circuits are positioned on the semiconductor die;
the semiconductor die comprises word line switch transistor regions and sense amplifier regions;
the first set of regions comprise word line switch transistors adjacent sense amplifiers; and
the second set of regions comprise word line switch transistors adjacent other peripheral circuits.

13. A non-volatile storage apparatus, comprising:
a memory die comprising multiple planes, each plane includes a three dimensional non-volatile memory array, the memory die includes a first set of bond pads, each of the three dimensional non-volatile memory arrays includes bit lines and word lines connected to non-volatile memory cells; and
a control die comprising a second set of bond pads and one or more control circuits configured to control the memory die, the second set of bond pads are bonded to the first set of bond pads;
the one or more control circuits include word line switch transistors, word line hook up signal lines connecting the word line switch transistors with the second set of bond pads, and pass through signal lines that provide electrical connections between components of the control die;
regions of the control die below end portions of the planes of the memory die are divided into a first set of regions and a second set of regions;
the memory die includes a first metal line layer and a second metal line layer, the first metal line layer is positioned between the second metal line layer and the multiple planes, the second metal line layer is positioned between the first metal line layer and the first set of bond pads, the multiple planes include bit lines formed in the first metal line layer;
above the first set of regions, the second metal line layer includes connections from the first set of bond pads to the bit lines formed in the first metal line layer and the second metal line layer does not include connections from the first set of bond pads to the word lines; and above the second set of regions, the second metal line layer includes connections from the first set of bond pads to the word lines and the second metal line layer does not include connections from the first set of bond pads to the bit lines formed in the first metal line layer.

14. The non-volatile storage apparatus of claim 13, wherein:
the word lines are arranged in an inverted staircase structure such that word line length increases from bottom to top of the respective three dimensional non-volatile memory array.

15. The non-volatile storage apparatus of claim 13, wherein:
the control die includes word line switch transistor regions and sense amplifier regions and peripheral circuit regions;
the first set of regions include word line switch transistor regions and are positioned adjacent to sense amplifier regions; and
the second set of regions are include word line switch transistor regions and are positioned adjacent to peripheral circuit regions.

16. The non-volatile storage apparatus of claim 13, wherein:
the control die includes word line switch transistor regions and sense amplifier regions and peripheral circuit regions;
the word line switch regions include first portions below word line hook up regions of the three dimensional non-volatile memory structure and second portions that are not below word line hook up regions of the three dimensional non-volatile memory structure;
bond pads of the first set of bond pads positioned above first portions of word line switch regions are connected to the word lines;
above the second set of regions, bond pads of the first set of bond pads positioned above second portions of word line switch regions are connected to the word lines;
above the first set of regions, there are no connections between word lines and bond pads of the first set of bond pads.

17. The non-volatile storage apparatus of claim 13, wherein the control die further comprises:
a first set of one or more metal line layers above the one or more control circuits;
a second set of one or more metal line layers above the one or more control circuits; and
a third set of one or more metal line layers above the one or more control circuits;
the first set of regions include word line hook up signal lines in the first set of one or more metal line layers, pass through signal lines in the second set of one or more metal line layers, and word line hook up signal lines in the third set of one or more metal line layers;
the second set of regions include word line hook up signal lines in the first set of one or more metal line layers, pass through signal lines in the second set of one or more metal line layers, and pass through signal lines in the third set of one or more metal line layers.

18. A method comprising:
fabricating a memory die comprising multiple planes, each plane includes a three dimensional non-volatile memory array, the memory die includes a first set of bond pads, each of the three dimensional non-volatile memory arrays includes bit lines and word lines connected to non-volatile memory cells, the memory die includes a first metal line layer and a second metal line layer, the first metal line layer is positioned between the second metal line layer and the multiple planes, the second metal line layer is positioned between the first metal line layer and the first set of bond pads, the bit lines are formed in the first metal line layer;
fabricating a control die comprising a second set of bond pads and one or more circuits for controlling the memory die, the one or more control circuits include word line switch transistors and word line hook up signal lines connecting the word line switch transistors with the second set of bond pads, the one or more control circuits further include pass through signal lines that provide electrical connections between components of the control die, regions of the control die below end portions of the planes of the memory die are divided into a first set of regions and a second set of regions; and
bonding the control die to the memory die by connecting the first set of bond pads to the second set of bond pads;
the fabricating the memory die comprises
above the first set of regions, forming connections in the second metal line layer from the first set of bond pads to the bit lines and without forming connections in the second metal line layer from the first set of bond pads to the word lines; and
above the second set of regions, forming connections in the second metal line layer from the first set of bond pads to the word lines without forming connections in the second metal line layer from the first set of bond pads to the bit lines.

19. The method of claim 18, wherein:
the control die includes word line switch transistor regions and sense amplifier regions and peripheral circuit regions;
the first set of regions include word line switch transistor regions and are positioned adjacent to sense amplifier regions; and
the second set of regions are include word line switch transistor regions and are positioned adjacent to peripheral circuit regions.

20. The method of claim 18, wherein the control die further comprises:
a first set of one or more metal line layers above the one or more control circuits, a second set of one or more metal line layers above the one or more control circuits and a third set of one or more metal line layers above the one or more control circuits;
the fabricating the control die comprises
in the first set of regions, forming word line hook up signal lines in the first set of one or more metal line layers, pass through signal lines in the second set of one or more metal line layers, and word line hook up signal lines in the third set of one or more metal line layers; and
in the second set of regions, forming word line hook up signal lines in the first set of one or more metal line layers, pass through signal lines in the second set of one or more metal line layers, and pass through signal lines in the third set of one or more metal line layers.

* * * * *